(12) United States Patent
Kimura

(10) Patent No.: US 6,683,497 B2
(45) Date of Patent: Jan. 27, 2004

(54) MOS LINEAR TRANSCONDUCTANCE AMPLIFIER

(75) Inventor: Katsuji Kimura, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 09/946,753

(22) Filed: Sep. 6, 2001

(65) Prior Publication Data

US 2002/0050860 A1 May 2, 2002

(30) Foreign Application Priority Data

Sep. 8, 2000 (JP) ........................................ 2000-272597

(51) Int. Cl.[7] ................................................ H03F 3/45
(52) U.S. Cl. ........................................ 330/253; 327/563
(58) Field of Search ................................ 330/253, 254, 330/257; 327/563

(56) References Cited

U.S. PATENT DOCUMENTS

| 5,381,113 A | * | 1/1995 | Kimura | 330/253 |
| 5,602,509 A | * | 2/1997 | Kimura | 330/253 |
| 5,942,934 A | * | 8/1999 | Ngo et al. | 327/540 |
| 5,963,064 A | * | 10/1999 | Toyota et al. | 327/103 |
| 5,990,729 A | * | 11/1999 | Kozuka et al. | 327/543 |
| 6,021,071 A | * | 2/2000 | Otsuka | 365/189.05 |

FOREIGN PATENT DOCUMENTS

| EP | 0 597 420 A1 | 5/1994 |
| JP | 2556293 | 5/1996 |
| JP | 2526808 | 6/1996 |
| JP | 2638492 | 4/1997 |
| JP | 10-209781 | 8/1998 |
| JP | 10-229311 | 8/1998 |
| JP | 11-251848 | 9/1999 |
| JP | 2000-077949 | 3/2000 |

* cited by examiner

Primary Examiner—Terry D. Cunningham
Assistant Examiner—Quan Tra
(74) Attorney, Agent, or Firm—McGinn & Gibb, PLLC

(57) ABSTRACT

To provide a linear transconductance amplifier which is easily implemented with LSI and has a linear transconductance superior in a frequency characteristic. In a MOS linear transconductance amplifier according to the present invention, gates of transistors M1 and M2 whose sources are grounded form an input pair, to which a differential voltage is inputted, the gate and drain of a transistor M3 are mutually connected, and drains of the transistors M1, M2 and M3 are mutually connected and are driven by a constant current. The MOS linear transconductance amplifier includes a unit for adding a current flowing in the transistor M1 to a current that is a half of a current flowing in the transistor M3, and a unit for adding a current flowing in the transistor M2, and a current that is a half of a current flowing in the transistor M3, and these two sum currents are made to be differential output current.

24 Claims, 15 Drawing Sheets

MOS LINEAR TRANSCONDUCTANCE AMPLIFIER

BACKGROUND OF THE INVENTION

1. Field of the Invention

The present invention relates to a MOS differential amplifier circuit having linear transconductance formed on a semiconductor integrated circuit, and in particular, to a MOS linear transconductance amplifier that operates in a low voltage and is excellent in a frequency characteristic.

2. Description of the Prior Art

FIG. 8 is a circuit diagram showing a conventional MOS linear transconductance amplifier disclosed in Japanese Patent Laid-Open No. 11-251848.

This MOS linear transconductance amplifier comprises a MOS differential pair 1 formed with two n-channel MOS transistors M1 and M2 whose sources are connected with each other, and two n-channel MOS transistors M3 and M4 which operate as their load.

Sources of the MOS transistors M1 and M2 that form the MOS differential pair 1 are grounded through a constant current source 2 (current value: $I_{ss}$). This MOS differential pair 1 is driven by the constant current $I_{ss}$ generated by the constant current source 2. Gates of the MOS transistors M1 and M2 form an input terminal pair of the amplifier concerned, and an input voltage $V_i$ is applied between those gates. Each ratio (W/L) of gate width (W) and gate length (L) of the MOS transistors M1 and M2 is $K_1$ as large as that of a unit MOS transistor ($K_1$ is a constant, but $K_1 \geq 1$).

The MOS transistor M3 operates as the load of the MOS transistor M1. A source of the MOS transistor M3 is connected to a drain of the MOS transistor M1, and the drain of the MOS transistor M3 is connected to a supply voltage line from which supply voltage $V_{DD}$ is applied, and a bias voltage (DC constant voltage) $V_B$ is applied to a gate of the MOS transistor M3.

The MOS transistor M4 operates as the load of the MOS transistor M2. A source of the MOS transistor M4 is connected to a drain of the MOS transistor M2, a drain of the MOS transistor M4 is connected to the supply voltage line from which the supply voltage $V_{DD}$ is applied, and the same bias voltage $V_B$ as that applied to the MOS transistor M3 is applied to a gate of the MOS transistor M4. Each ratio (W/L) of gate width (W) and gate length (L) of the MOS transistors M3 and M4 is $K_2$ as large as that of the unit MOS transistor ($K_2$ is a constant, however $K_2 \geq 1$).

Next, the operation principle of a MOS linear transconductance amplifier shown in FIG. 8 will be described.

It is assumed that a body effect and a channel length modulation are disregarded and the relation between a drain current $I_D$ and a voltage between the gate and source of a MOS transistor which is operating in a saturation region follows a square-law. Then, the drain current $I_D$ is expressed as shown in a following formulas (1a) and (1b):

$$\begin{cases} I_D = K\beta(V_{GS} - V_{TH})^2 & (V_{GS} \geq V_{TH}) \\ I_D = 0 & (V_{GS} \leq V_{TH}) \end{cases} \quad (1a)$$

In these formulas (1a) and (1b), a symbol K is a ratio of the ratio (W/L) of the gate width (W) and gate length (L) of the MOS transistor to that of the unit MOS transistor. In addition, a symbol $\beta$ is a transconductance parameter and a symbol $V_{TH}$ is threshold voltage. Assuming that an effective mobility of a carrier is $\mu$ and a gate oxide film capacity per unit area is $C_{OX}$, the transconductance parameter $\beta$ will be defined by $\beta = \mu (C_{OX}/2) (W/L)$.

If it is assumed that characteristics of elements are almost consistent with each other, the two output currents $I_{D1}$ and $I_{D2}$ of the MOS differential pair 1, i.e., the drain currents of these MOS transistors M1 and M2, are expressed as shown in the following formulas (2a) and (2b), respectively.

$$I_{D1} = \frac{1}{2}\left\{I_0 + K_1\beta V_i\sqrt{\frac{2I_{ss}}{K_1\beta} - V_i^2}\right\} \left(|V_i| \leq \sqrt{\frac{I_{ss}}{K_1\beta}}\right) \quad (2a)$$

$$I_{D2} = \frac{1}{2}\left\{I_0 - K_1\beta V_i\sqrt{\frac{2I_{ss}}{K_1\beta} - V_i^2}\right\} \left(|V_i| \leq \sqrt{\frac{I_{ss}}{K_1\beta}}\right) \quad (2b)$$

As shown in formulas (2a) and (2b), an operational input voltage range of the MOS differential pair 1 is $|V_i| \leq \sqrt{\{I_{ss}/(K_1\beta)\}}$.

The drain currents $I_{D1}$ and $I_{D2}$ of the MOS transistors M1 and M2 expressed in formulas (2a) and (2b) are converted into voltages respectively by square root (root) compression performed by the MOS transistors M3 and M4 serving as their loads. Therefore, two output voltages $V_{O1}$ and $V_{O2}$ of the MOS differential pair 1 having the MOS transistors M3 and M4 as loads are generated in the drains of the MOS transistors M1 and M2 respectively, and are expressed in the following formulas (3a) and (3b).

$$V_{D1} = V_B - V_{TH} - \sqrt{\frac{I_{D1}}{K_2\beta}} \left(|V_i| \leq \sqrt{\frac{I_{ss}}{K_1\beta}}\right) \quad (3a)$$

$$V_{D2} = V_B - V_{TH} - \sqrt{\frac{I_{D2}}{K_2\beta}} \left(|V_i| \leq \sqrt{\frac{I_{ss}}{K_1\beta}}\right) \quad (3b)$$

That is, when a differential output voltage of the MOS differential pair 1 is defined as $\Delta V$, the $\Delta V$ is expressed as follows.

$$\Delta V = V_{O1} - V_{O2} = -\frac{1}{\sqrt{K_2\beta}}\left(\sqrt{I_{D1}} - \sqrt{I_{D2}}\right) \quad (4)$$

Here, a following formula (5) is introduced. In the formula (5), symbols a and b are constants and symbol x is a variable.

$$b\left(\sqrt{a + \sqrt{2}x\sqrt{1 - \frac{x^2}{2}}} - \sqrt{a - \sqrt{2}x\sqrt{1 - \frac{x^2}{2}}}\right) = b\sqrt{2}x \quad (5)$$

In addition, in the formula (5), these symbols a, b, and x are set up as follows.

$$a = 1, b = \sqrt{I_{ss}/2}, x = V_i \bigg/ \sqrt{\frac{I_{ss}}{K_1\beta}} \quad (6)$$

Then, the left side of the formula (5) becomes equal to what is obtained by substituting the formulas (2a) and (2b) for the formula (4). At this time, the right-hand side of the formula (5) becomes $\sqrt{(K_1\beta)} \cdot V_i$. Therefore, the following formula (7) is obtained.

$$\Delta V = \frac{1}{\sqrt{K_2\beta}}(\sqrt{I_{D1}} - \sqrt{I_{D2}}) = \frac{1}{\sqrt{K_2\beta}}\sqrt{K_1\beta}\ V_i \left(|V_i| \leq \sqrt{\frac{I_{SS}}{K_1\beta}}\right) \quad (7)$$

It is obvious from FIG. 7, the differential output voltage $\Delta V$ of the MOS differential pair 1, i.e., a difference between the square roots of the drain current $I_{D1}$ and drain current $I_{D2}$ expressed by the formulas (2a) and (2b), respectively, is proportional to an input voltage $V_i$ as apparent from this formula (7).

In addition, when a differential output current of the MOS differential pair 1 is defined as $\Delta I_D$, $\Delta I_D$ is expressed like a following formula (8) with using drain currents $I_{D1}$ and $I_{D2}$.

$$\Delta I_D = I_{D1} - I_{D2} = (\sqrt{I_{D1}} - \sqrt{I_{D2}})(\sqrt{I_{D1}} + \sqrt{I_{D2}}) \quad (8)$$

$$= K_1\beta V_i \sqrt{\frac{2I_{SS}}{K_1\beta} - V_i^2} \left(|V_i| \leq \sqrt{\frac{I_{SS}}{K_1\beta}}\right)$$

Therefore, it can be seen that the differential output current $\Delta I_D$ of the MOS differential pair 1 includes a linear term shown in formula (9) and a nonlinear term shown in formula (10) as follows:

$$\sqrt{I_{D1}} - \sqrt{I_{D2}} = \sqrt{K_1\beta}\ V_i \left(|V_i| \leq \sqrt{\frac{I_{SS}}{K_1\beta}}\right) \quad (9)$$

$$\sqrt{I_{D1}} + \sqrt{I_{D2}} = \sqrt{K_1\beta} \sqrt{\frac{2I_{SS}}{K_1\beta} - V_i^2} \left(|V_i| \leq \sqrt{\frac{I_{SS}}{K_1\beta}}\right) \quad (10)$$

Letting the source voltage of the MOS transistors M1 and M2, which form the MOS differential pair 1 and whose sources are mutually connected, be a common source voltage $V_{S1}$, the common source voltage $V_{S1}$ is expressed in the following formula (11).

$$V_{S1} = V_{CM1} - V_{TH} - \frac{1}{2}\sqrt{\frac{2I_{SS}}{K_1\beta} - V_i^2} \quad (11)$$

In the formula (11), $V_{CM1}$ is a common mode voltage of the input voltage $V_i$ that is differentially inputted. As shown in the formula (11), since the common source voltage $V_{S1}$ is a function of the input voltage $V_i$, the common source voltage $V_{S1}$ is changed with an input voltage $V_i$. Moreover, a 3rd term (square root term) in the formula (11) is equal to a second square root portion in the nonlinear term (10) with disregarding a value of a coefficient that is a multiplier to it. Therefore, it is understood that the nonlinear term (9) of the differential output current $\Delta I_D$ in the MOS differential pair 1 originates in the change of the common source voltage $V_{S1}$.

This means that, if it is possible to fix the common source voltage $V_{S1}$ of the MOS differential pair 1 to a constant voltage, a linear operation of the MOS differential pair 1 can be performed. Therefore, the differential output voltage $\Delta V$ of the MOS differential pair 1 is expressed like the following formula (12).

$$\Delta V = V_{O1} - V_{O2} = -\sqrt{\frac{K_1}{K_2}}\ V_i \left(|V_i| \leq \sqrt{\frac{I_{SS}}{K_1\beta}}\right) \quad (12)$$

In the formula (12), if the ratio $K_2$ of the gate width (W) and gate length (L) of the MOS transistors M3 and M4 that serve as loads is larger than the ratio $K_1$ of the gate width (W) and gate length (L) of the MOS transistors M1 and M2 which form the MOS differential pair 1, this MOS differential pair 1 serves as a antiphase linear attenuator. On the other hand, if $K_2$ is equal to or smaller than $K_1$, this MOS differential pair 1 serves as a antiphase linear amplifier. Here, its good linearity is realized over the entire operation input voltage range $|V_i| \leq \sqrt{\{I_{SS}/(K_1\beta)\}}$.

As obvious from the formula (12), the differential output voltage $\Delta V$ of the MOS differential pair 1 having the MOS transistors M3 and M4 as loads is proportional to the input voltages $V_i$. In other words, the MOS differential pair 1 having the MOS transistors M3 and M4 as loads operates as the linear attenuator or the linear amplifier to the input voltage $V_i$. Then, if $(K_2/K_1)$ is set as a small value, a high gain can be realized.

In addition, when a common mode voltage of output voltages $V_{O1}$ and $V_{O2}$ is defined as $V_{CM2}$, the common mode voltage $V_{CM2}$ is expressed with the following formula (13).

$$V_{CM2} = \frac{V_{O1} + V_{O2}}{2} = V_B - V_{TH} - \sqrt{\frac{I_{D1}}{K_2\beta}} - \sqrt{\frac{I_{D2}}{K_2\beta}} \quad (13)$$

$$= V_B - V_{TH} - \frac{1}{2}\sqrt{\frac{K_1}{K_2}}\sqrt{\frac{2I_{SS}}{K_1\beta} - V_i^2}$$

$$= V_B - V_{TH} - \sqrt{\frac{K_1}{K_2}}(V_{CM1} - V_{TH} - V_{S1})\left(|V_i| \leq \sqrt{\frac{I_{SS}}{K_1\beta}}\right)$$

The formula (13) shows that the common mode voltage $V_{CM2}$ of the output voltages $V_{O1}$ and $V_{O2}$ of the MOS differential pair 1 which have the MOS transistors M3 and M4 as loads are expressed with using the common source voltage $V_{S1}$ (refer to the above-described formula (11)).

FIG. 9 is a graph showing a calculated values of the output voltage characteristic of the MOS differential pair 1 shown in FIG. 8.

In FIG. 9, two curves 31 and 32 show the output voltages $V_{O1}$ and $V_{O2}$ of the MOS differential pair 1 respectively, and a curve 33 shows the common mode voltage $V_{CM2}$ of the input voltage $V_i$. A curve 34 shows a voltage $[-V_{O1}+2(V_B-V_{TH})]$, and a straight line 35 shows a voltage $[V_{O2}-V_{O1}+V_B-V_{TH}]$. It is obvious from straight line 35, the differential output voltage $\Delta V$ of the MOS differential pair 1 is proportional to the input voltage $V_i$.

FIG. 10 is a circuit diagram showing a MOS triple-tail cell 3 used for a MOS linear transconductance amplifier (refer to FIG. 11) according to an embodiment of the present invention.

This MOS linear transconductance amplifier has a configuration of combining the MOS triple-tail cell shown in FIG. 10, and the MOS linear transconductance amplifier shown in FIG. 8. As shown in FIG. 10, this MOS triple-tail cell 3 is formed with three n-channel MOS transistors M5, M6 and M7 whose sources are connected each other. The sources of the MOS transistors M5, M6 and M7 are grounded in common through a constant current source 4 (current value: $I_0$). This MOS triple-tail cell 3 is driven by the constant current $I_0$ generated by the constant current source 4.

Each ratio (W/L) of the gate width (W) and gate length (L) of the MOS transistors M5 and M6 are equal to that of the unit MOS transistor, respectively. A ratio (W/L) of the gate width (W) and gate length (L) of the MOS transistor M7 is $K_3$ times as large as that of the unit MOS transistor ($K_3$ is a constant, however $K_3 \geq 1$).

The first output voltage $V_{O1}$ of the MOS differential pair 1 generated in the drain of the MOS transistor M1 forming the MOS differential pair 1 (namely, the MOS linear transconductance amplifier in FIG. 8) is applied to the gate of the MOS transistor M5. At the same time, the second output voltage $V_{O2}$ of the MOS differential pair 1 generated in the drain of MOS transistor M2 forming the MOS differential pair 1 is applied to the gate of MOS transistor M6. The Difference (namely, differential output voltage of the MOS differential pair) $\Delta V$ between these two output voltages $V_{O1}$ and $V_{O2}$ becomes the input voltage of the triple-tail cell 3.

A drain of the MOS transistor M7 is connected to a supply voltage line ($V_{DD}$), and a control voltage (DC constant voltage) $V_c$ is applied to its gate. Two drains of the MOS transistors M5 and M6 forms an output terminal pair of this triple-tail cell 3, and output currents $I^+$ and $I^-$ are taken out from the output terminal pair, respectively. An n-channel MOS transistor M8 and a constant current source 5 (current value: $I_{ss}/2$) constitute a control voltage generating circuit for generating the control voltage $V_c$ for the MOS transistor M7. A source of the MOS transistor M8 is grounded through the constant current source 5, a drain of the MOS transistor M8 is connected to a supply voltage line ($V_{DD}$), and a bias voltage $V_B$ is applied to its gate.

Next, an operation principle of this MOS triple-tail cell 3 will be described.

A MOS quadritail cell consists of the unit transistors M5 and M6 and the transistors M7 and M8. Here, transistor size ratios of the transistors M7 and M8 to the unit transistor are $K_3$, and the sources of the transistors M5 to M7 are commonly connected and are driven by the constant current $I_0$. When a voltage $\Delta V$ is applied between the gates of the transistors M5 and M6, and a voltage $V_c$ is applied to the gate of the transistor M7, and $V_{CM3}$ is input common mode voltage, the drain currents of respective transistors are expressed as follows:

$$I_{D5} = \beta(V_{CM3} + \Delta V/2 - V_{S2} - V_{TH})^2 \tag{14}$$

$$I_{D6} = \beta(V_{CM3} - \Delta V/2 - V_{S2} - V_{TH})^2 \tag{15}$$

$$I_{D7} = I_{D8} = K_3\beta(V_{CM3} + V_C - V_{S2} - V_{TH})^2 \tag{16}$$

where an input common mode voltage is made to be $V_{CM3}$. Here, a symbol $V_{S2}$ is a common source voltage of the MOS quadritail cell.

Moreover, the following formula is obtained from a condition of the tail current:

$$I_{D5} + I_{D6} + I_{D7} + I_{D8} = I_0 \tag{17}$$

With solving formula ($V_{CM3} - V_{S2} - V_{TH}$) by substituting the formulas (14) to (16) for the formula (17), the solution is as follows:

$$V_{CM3} - V_{S2} - V_{TH} = \frac{-K_3 V_C + \sqrt{(K_3+1)\frac{I_0}{2\beta} - \frac{K_3+1}{4}(\Delta V)^2 - K_3 V_C^2}}{K_3 + 1} \tag{18}$$

When the drain currents of MOS transistors M5 and M6 are defied as $I_{D5}$ and $I_{D6}$ respectively, a differential output current $\Delta I$ (=$I^+ - I^-$) of this triple-tail cell 3 is expressed in the following formula (19).

$$\Delta I = I_{D5} - I_{D6} = 2\beta(\Delta V)(V_{CM3} - V_{S2} - V_{TH}) \tag{19}$$

$$= \frac{-2K_3\beta(\Delta V)V_C + 2\beta(\Delta V)\sqrt{(K_3+2)\frac{I_0}{\beta} - \frac{K_3+2}{2}(\Delta V)^2 - 2K_3 V_C^2}}{K_3 + 2}$$

$$\left(|\Delta V| \leq \min\left\{\sqrt{\frac{2I_0}{\beta} - 4V_C^2}, \frac{-2K_3 V_C + 2\sqrt{(K_3+4)\frac{I_0}{\beta} - 4K_3 V_C^2}}{K_3 + 4}\right\}\right)$$

Here, the differential output voltage $\Delta V$ of the MOS differential pair 1 that is inputted between the gates of the MOS transistors M5 and M6 is linear to the input voltage $V_i$ inputted to the MOS differential pair 1 (that is, this amplifier). Moreover, the drain currents $I_{D5}$ and $I_{D6}$ of the MOS transistors M5 and M6 which form the triple-tail cell 3 have a square-law characteristics to the input voltage $\Delta V$ inputted to the triple-tail cell 3, respectively. In consideration of these, in order that the amplifier shown in FIG. 8 outputs a current having the square-law characteristics, it is necessary that the differential output current $\Delta I$ of this triple-tail cell 3 that is expressed in the formula (19) becomes linear to the input voltage $\Delta V$, i.e., that the differential output current $\Delta I$ is proportional to the input voltage $\Delta V$.

That is, when c is constant, it is required that satisfying a following formula:

$$\Delta I = c\Delta V \tag{20}$$

Therefore, a coefficient multiplied to $\Delta V$ of numerator of the above-described formula (19) must be equal to a constant c. In other words, it is necessary to satisfy a following formula (21).

$$-K_3 V_C + \sqrt{(K_3+2)\frac{I_0}{2\beta} - \frac{K_3+2}{4}(\Delta V)^2 - 2K_3 V_C^2} = c(\text{constant}) \tag{21}$$

Here, the differential output current $\Delta I$ of the triple-tail cell 3 is as follows.

$$\Delta I = \frac{2c\beta}{K_3 + 2}(\Delta V) \tag{22}$$

Moreover, with determining the control voltage $V_c$ at this time based on the formula (21), the control voltage $V_c$ is expressed as a following formula (23).

$$V_C = \frac{-K_3 c + \sqrt{K_3(K_3+2)^2 \frac{I_0}{\beta} - \frac{K_3(K_3+2)^2}{2}(\Delta V)^2 - 2K_3 c^2}}{K_3(K_3+2)} \quad (23)$$

Therefore, the differential output current $\Delta I$ of this triple-tail cell 3 expressed in the above-described formula (19) is linear to the input voltage $\Delta V$. That is, in order that the MOS linear transconductance amplifier shown in FIG. 8 outputs a current having a linear characteristics, the control voltage Vc must be set up so as to satisfy the formula (21). Then, the differential output current $\Delta I$ of the triple-tail cell 3 at that time is expressed in the above-described formula (22).

For example, when defining $C^2$ as follows:

$$c^2 = (K_3 + 2)^2 \frac{I_0}{4\beta} \quad (24)$$

the control voltage $V_c$ is required to be set as follows:

$$V_C = -\frac{1}{2}\sqrt{\frac{I_0}{\beta}} + \sqrt{\frac{I_0}{2K_3\beta} - \frac{1}{2K_3}(\Delta V)^2} \quad (25)$$

As described above, if the control voltage $V_c$ to the MOS transistor M7 of the triple-tail cell 3 is set up so as to satisfy the above-described formula (23), the differential output current $\Delta I$ of this triple-tail cell 3 expressed in the above-described formula (19) becomes linear to the input voltage $\Delta V$. Thus, the differential output current $\Delta I$ is expressed in the above-described formula (22).

FIG. 11 is a circuit diagram showing a MOS linear transconductance amplifier obtained in this way.

In this amplifier, a cascade connection of the MOS triple-tail cell 3 shown in FIG. 10 is performed to an output terminal of the MOS differential pair 1 (namely, MOS linear transconductance amplifier shown in FIG. 8) which consists of the MOS transistors M1 and M2, and MOS transistors M3 and M4 used as loads thereof. For this reason, respective gate voltages of the MOS transistors M5, M6 and M7 which form the triple-tail cell 3 become $V_{O1}$, $V_{O2}$ and ($V_{CM2}+V_c$). If the gate voltage ($V_{CM2}+V_c$)=$V_{G7}$ of the MOS transistor M7 becomes a constant value, a gate bias circuit for generating the control voltage $V_c$ can be simplified remarkably. Thereat, next, conditions necessary for it will be obtained.

Since the common mode voltage $V_{CM2}$ of the output voltages $V_{O1}$ and $V_{O2}$ is expressed in the above-described formula (13) and the control voltage $V_c$ is expressed as the above-described formula (23), the gate voltage $V_{G7}$= ($V_{CM2}+V_c$) of the MOS transistor M7 is expressed in the following formula (26). Here, symbol d is a constant.

$$V_{G7} = V_{CM2} + V_C \quad (26)$$

$$= V_B - V_{TH} - \frac{1}{2}\sqrt{\frac{K_1}{K_2}}\sqrt{\frac{2 I_{SS}}{K_1 \beta} - V_i^2} +$$

$$\frac{-K_3 c + \sqrt{K_3(K_3+2)^2 \frac{I_0}{\beta} - \frac{K_1 K_3(K_3+2)^2}{2 K_2}(\Delta V)^2 - 2 K_3 c^2}}{K_3(K_3+2)}$$

$$= d(\text{constant})$$

As mentioned above, it is required for the differential output current $\Delta I$ of the triple-tail cell 3 to be proportional to the input voltage $\Delta V$ in order that the MOS linear transconductance amplifier of FIG. 11 outputs the current having linear characteristics. Therefore, in the formula (26), all coefficients of the term containing the input voltage $\Delta V$ must be zero. That is, the formula (26) must be simplified like the following formula (27).

$$V_{CM2} + V_C = V_B - V_{TH} - \frac{c}{K_3 + 2} = d(\text{constant}) \quad (27)$$

Necessary conditions for satisfying the formula (27) are that satisfying two relational expressions (28a) and (28b) in the formula (26).

$$K_3 = 2 \quad (28a)$$

$$\frac{I_0}{\beta} = \frac{I_{SS}}{K_2 \beta} + \frac{c^2}{8} \quad (28b)$$

Therefore, when values such as current values $I_0$ and $I_{ss}$ are set up so as to satisfy such relational expressions (28a) and (28b), satisfying the formula (27) and the gate voltage $V_{G7}$=($V_{CM2}+V_c$) of the MOS transistor M7 becomes a constant value. Consequently, the bias circuit for generating the control voltage $V_c$ applied to the MOS transistor M7 is remarkably simplified as shown in FIG. 11. Then, in that case, since the control voltage $V_c$ follows the above-described formula (23) in the circuit configuration shown in FIG. 11, the differential output current $\Delta I$ of this triple-tail cell 3 becomes linear to the input voltage $\Delta V$ as expressed in the above-described formula (22).

Moreover, as mentioned above, the input voltage $\Delta V$ to the MOS triple-tail cell 3 is the differential output voltage $\Delta V$ of the MOS differential pair 1 having the MOS transistors M3 and M4 as loads, and is proportional to the input voltage $V_i$ to this amplifier concerned. In this way, it is assured that the amplifier in FIG. 11 outputs the output current $\Delta I$ having linear characteristics to the input voltage $V_i$ as the differential output current $\Delta I$ of the MOS triple-tail cell 3.

Next, an operational input voltage range of the MOS linear transconductance amplifier shown in FIG. 11 will be described.

The drain currents $I_{D5}$, $I_{D6}$ and $I_{D7}$ of the MOS transistors M5, M6 and M7 which form the triple-tail cell 3 are expressed in regard to the input voltage $\Delta V$ in the following formulas (29a), (29b) and (29c), respectively.

$$I_{D5} = \frac{\beta}{4}\left(\Delta V - \sqrt{\frac{I_0}{\beta}}\right)^2 \left(|\Delta V| \le \sqrt{\frac{I_0}{2\beta}}\right) \quad (29a)$$

$$I_{D6} = \frac{\beta}{4}\left(\Delta V + \sqrt{\frac{I_0}{\beta}}\right)^2 \left(|\Delta V| \le \sqrt{\frac{I_0}{2\beta}}\right) \quad (29b)$$

$$I_{D7} = \frac{1}{2}\{I_0 - \beta(\Delta V)^2\} \left(|\Delta V| \le \sqrt{\frac{I_0}{2\beta}}\right) \quad (29c)$$

Therefore, an effective tail current of two transistors that constitute a differential pair of a quadri-tail cell is shown as a following formula (30).

$$I_{D5} + I_{D6} = \frac{1}{2}\{I_0 + \beta(\Delta V)^2\}\left(|\Delta V| \leq \sqrt{\frac{I_0}{2\beta}}\right) \quad (30)$$

It is obvious from the formulas (29c) and (30), a sum current of two output currents I⁺ and I⁻ of the triple-tail cell 3 and $I_{D7}$ are proportional to the square value of the input voltage $\Delta V$ respectively, the sum current of those output currents I⁺ and I⁻ are equiphase square currents, and $I_{D7}$ shows the square current in an antiphase.

Next, the conditions that the linear input voltage range of the MOS triple-tail cell 3 and the operational input voltage range of the MOS differential pair 1 become equal will be obtained.

First, if $V_i$ is zero in the formula (28b), the formula (27) is satisfied also in the case of $V_o=0$. At this time, formulas (31) and (32) are obtained.

$$d = V_B - V_{TH} - \sqrt{\frac{I_{SS}}{2K_2\beta}} \quad (31)$$

$$c = 4\sqrt{\frac{I_{SS}}{2K_2\beta}} = 2\sqrt{\frac{2I_{SS}}{K_2\beta}} \quad (32)$$

Moreover, a following formula (33) is obtained by substituting the formula (32) for the formula (28b) and solving this.

$$I_0 = 2\frac{I_{SS}}{K_2} \quad (33)$$

In the case of $K_1=K_2=1$, $K_3=2$ and $I_{ss}=I_0/2$, the circuit configuration shown in FIG. 11 can be most simplified. At this time, a value of the constant c can be calculated from formula (34).

$$c = 2\sqrt{\frac{I_0}{\beta}} \quad (34)$$

Moreover, the constant d and the control voltage $V_c$ at this time become as shown in a following formulas (35) and (36), respectively.

$$d = V_{CM2} + V_C = V_B - V_{TH} - 2\sqrt{\frac{I_0}{\beta}} \quad (35)$$

$$V_C = \frac{1}{2}\left\{-\sqrt{\frac{I_0}{\beta}} + \sqrt{\frac{I_0}{\beta} - (\Delta V)^2}\right\} \quad (36)$$

At this time, the differential output current $\Delta I$ of the linear transconductance amplifier shown in FIG. 11 is expressed in formula (37).

$$\Delta I = I_{D5} - I_{D6} = -\sqrt{\beta I_0}\, V_i \left(|V_i| \leq \sqrt{\frac{I_0}{2\beta}}\right) \quad (37)$$

At this time, an operation range $|V_i| \leq \sqrt{(I_0/\beta)}$ becomes equal to the operation range of the MOS differential pair having transistors as loads. A transconductance is expressed in formula (38).

$$\frac{d(\Delta V)}{dV_i} = -\sqrt{\beta I_0}\left(|V_i| \leq \sqrt{\frac{I_0}{2\beta}}\right) \quad (38)$$

The MOS transistor M7 constituting the triple-tail cell 3 shown in FIG. 10 has a ratio (W/L) between the gate width (W) and gate length (L) that is two times of the ratio of the unit MOS transistor ($K_3=2$). Therefore, the MOS transistor M7 can be divided into two unit MOS transistors M7A and M7B all of whose sources, drains and gates are connected each other. Thus, the triple-tail cell 3 can be modified into a quadri-tail cell 3' shown in FIG. 12. Here, sources of the MOS transistors M7A and M7B of the quadritail cell 3' are connected to each source of the MOS transistors M5 and M6, respectively. In addition, two resistors (not shown) having resistances each are $R_L$ are added as loads of the MOS transistors M5 and M6. Thus, the amplifier performs class A operation. This will be described with using FIG. 11.

FIG. 13 is a graph showing a characteristics of drain currents $I_{D5}$, $I_{D6}$, $I_{D7A}$ and $I_{D7B}$ of the MOS transistors M5, M6, M7A and M7B constiting the quadri-tail cell 3'.

In FIG. 13, curves 51, 52 and 53 show that each of the drain currents $I_{D5}$, $I_{D6}$, $I_{D7A}$ and $I_{D7B}$ has square-law characteristics. Moreover, a curve 54 shows that a sum of the drain currents $I_{D7A}$ and $I_{D7B}$ also has the square-law characteristics. Furthermore, it can be also seen from a curve 55 shows that a sum of the drain currents $I_{D5}$ and $I_{D7A}$ has linear characteristics, and also from a curve 56 that a sum of drain currents $I_{D6}$ and $I_{D7B}$ has linear characteristics. In this way, the differential output current $\Delta I$ in the linear transconductance amplifier is converted into a voltage, which is taken out as the differential output voltage $\Delta V_o$.

It is obvious from FIG. 13, it can be seen from the curve 55 that the sum of the drain currents $I_{D5}$ and $I_{D7A}$ has linear characteristics, and from the curve 56 that the sum of the drain currents $I_{D6}$ and $I_{D7B}$ has linear characteristics. Hence, in the amplifier according to this fifth embodiment, the differential output current $\Delta I$ can be expressed as $\Delta I=(I_{D5}+I_{D7A})-(I_{D6}+I_{D7B})$ and this also becomes linear in a wide input voltage range $|V_i| \leq \sqrt{(I_0/2\beta)}$. Therefore, the differential output voltage $V_o$ obtained by performing the voltage conversion of the differential output current $\Delta I$ by the resistors also has linear characteristic in a wide input voltage range $|V_i| \leq \sqrt{(I_0/2\beta)}$.

FIG. 14 is a graph showing the calculated values of transfer characteristics of the MOS linear transconductance amplifier shown in FIG. 12 are shown.

In FIG. 14, two curves 81 and 82 show changes of the output currents $(I_{D6}+I_{D7B})$ and $(I_{D5}+I_{D7A})$ in the MOS linear transconductance amplifier shown in FIG. 12. FIG. 14 shows that the output currents $(I_{D6}+I_{D7B})$ and $(I_{D5}+I_{D7A})$ in the MOS linear transconductance amplifier have the linear characteristics.

Otherwise, this kind of MOS linear transconductance amplifier is described in Japanese Patent Laid-Open No. 10-209781. This circuit is shown in FIG. 15. Although an operation of this circuit is analyzed in preferred embodiments in the above-described Japanese Patent Laid-Open No. 10-209781 using formulas. However, each formula does not have a middle voltage $V_{CM}$. Therefore, it is difficult to understand the operation. Moreover, since an operational input voltage range and a linear input voltage range are not shown and it is also not shown why the linear input voltage range is wide or how the linear input voltage range can be extended, technical disclosure is not sufficient.

Then, the present inventor will simply show these by performing a circuit analysis. In this circuit, since all transistors M1 to M9 are the same transistors, the circuit analysis becomes simpler by several steps than that in the case of being Japanese Patent Laid-Open No. 11-251848. In FIG. 15, the transistors M5 to M9 are mutually connected at their sources, and are driven by a constant current source $5I_{ss}$.

$$I_{D5}+I_{D6}+I_{D7}+I_{D8}+I_{D9}=5I_{SS} \quad (39)$$

Moreover, a current flowing in the transistor M5 drives four transistors M5 to M8 whose drains are mutually connected through a 1:4 current mirror circuit consisting of transistors M14 to M18.

Thus, the following formula is obtained:

$$I_{D5}+I_{D6}+I_{D7}+I_{D8}=4I_{D9} \quad (40)$$

Hence, solving the formulas (39) and (40), the following formulas can be obtained:

$$I_{D5}=\beta(V_{CM}-V_{n2}-V_{TH})^2=I_{SS} \quad (41)$$

$$I_{D5}+I_{D6}+I_{D7}+I_{D8}=4I_{SS} \quad (42)$$

However, $V_{n2}$ denotes a common source voltage.

From the formula (41), the following formula can be obtained:

$$V_{CM}-V_{n2}-V_{TH}=\sqrt{\frac{I_{SS}}{\beta}} \quad (43)$$

Moreover, satisfy the following formulas:

$$I_{D5}=\beta\left(V_{CM}+\frac{V_i}{2}-V_{n2}-V_{TH}\right)^2 \quad (44)$$

$$I_{D6}=\beta\left(V_{CM}-\frac{V_i}{2}-V_{n2}-V_{TH}\right)^2 \quad (45)$$

$$I_{D7}=I_{D8}=\beta(V_{CONT}-V_{n2}-V_{TH})^2 \quad (46)$$

Hence, with substituting the formulas (44) to (46) for the formula (42) and rewriting the formula (42) with using the formula (43), the following formula can be obtained:

$$V_{CONT}-V_{CM}=-\sqrt{\frac{I_{SS}}{\beta}}+\sqrt{\frac{I_{SS}}{\beta}-\frac{V_i^2}{4}} \quad \left(|V_i|\le\sqrt{\frac{2I_{SS}}{\beta}}\right) \quad (47)$$

The input operation range where the formula (47) can be obtained is given from the following condition in which no transistors M5 to M9 become pinch-off:

$$\left(\sqrt{\frac{I_{SS}}{2\beta}}\le\sqrt{\frac{I_{SS}}{\beta}-\frac{V_i^2}{4}}\quad\left(\le\sqrt{\frac{I_{SS}}{\beta}}\right)\right)$$

With substituting the formulas (43) and (47) for the formulas (44) to (46), the followings can be obtained:

$$I_{D5}=\frac{\beta}{4}V_i^2+\sqrt{\beta I_{SS}}\,V_i+I_{SS}\quad\left(|V_i|\le\sqrt{\frac{2I_{SS}}{\beta}}\right) \quad (48)$$

$$I_{D6}=\frac{\beta}{4}V_i^2-\sqrt{\beta I_{SS}}\,V_i+I_{SS}\quad\left(|V_i|\le\sqrt{\frac{2I_{SS}}{\beta}}\right) \quad (49)$$

$$I_{D7}=I_{D8}=I_{SS}-\frac{\beta}{4}V_i^2\quad\left(|V_i|\le\sqrt{\frac{2I_{SS}}{\beta}}\right) \quad (50)$$

Hence, the following formulas can be obtained:

$$I_{D5}+I_{D7}=2I_{SS}+\sqrt{\beta I_{SS}}\,V_i\quad\left(|V_i|\le\sqrt{\frac{2I_{SS}}{\beta}}\right) \quad (51)$$

$$I_{D6}+I_{D8}=2I_{SS}-\sqrt{\beta I_{SS}}\,V_i\quad\left(|V_i|\le\sqrt{\frac{2I_{SS}}{\beta}}\right) \quad (52)$$

Thus, both $I_{D5}+I_{D7}$ and $I_{D6}+I_{D5}$ are linear differential currents.

Here, a control voltage generating circuit consisting of the transistors M5 to M9 will be compared to an output circuit consisting of transistors M1 to M4. Supposing that the constant current $I_{ss}$ is removed since the current always flows in the transistor M5, it can be seen that the transistors M1 to M4 and transistors M5 to M8 have mutually equal bias conditions.

Hence, the following formulas can be obtained:

$$I_{D1}+I_{D3}=2I_{SS}+\sqrt{\beta I_{SS}}\,V_i\quad\left(|V_i|\le\sqrt{\frac{2I_{SS}}{\beta}}\right) \quad (53)$$

$$I_{D2}+I_{D4}=2I_{SS}-\sqrt{\beta I_{SS}}\,V_i\quad\left(|V_i|\le\sqrt{\frac{2I_{SS}}{\beta}}\right) \quad (54)$$

Both $I_{D1}+I_{D3}$ and $I_{D2}+I_{D4}$ are linear differential currents. That is, two output currents are expressed as follows:

$$I_{On}=-\sqrt{\beta I_{SS}}\,V_i\quad\left(|V_i|\le\sqrt{\frac{2I_{SS}}{\beta}}\right) \quad (55)$$

$$I_{Op}=+\sqrt{\beta I_{SS}}\,V_i\quad\left(|V_i|\le\sqrt{\frac{2I_{SS}}{\beta}}\right) \quad (56)$$

Hence, a linear OTA is realizable.

However, since the conventional MOS linear transconductance amplifier described above reverses a voltage with the antiphase amplifier, it is not able to lower a power supply voltage in order to maintain a linear operating input voltage. Alternatively, there is a disadvantage that, even if it is possible to lower the voltage, a circuit current in the control voltage generating circuit becomes larger than a circuit current in the main output circuit.

BRIEF SUMMARY OF THE INVENTION

Object of the Invention

In analog signal processing, a differential amplifier circuit is an essential function block. In particular, a demand of a linear MOS differential amplifier circuit has increased further. Therefore, an object of the present invention is to provide a MOS linear transconductance amplifier that can be realized with an LSI and has the linear transconductance excellent in the frequency characteristic.

SUMMARY OF THE INVENTION

A MOS linear transconductance amplifier according to claim 1 is characterized in: that gates of first and second transistors whose sources are grounded form an input pair, to which a differential voltage is inputted; that a gate and drain of a third transistor are mutually connected; that drains of the above first, second and third transistors are mutually connected and are driven by a constant current; wherein the MOS linear transconductance amplifier comprises means for adding a current flowing in the above-described first transistor to a current that is a half of a current flowing in the above-described third transistor, and means for adding a current flowing in the above-described second transistor, and a current that is a half of a current flowing in the above-described third transistor; and that these two sum currents are made to be a differential output current.

A MOS linear transconductance amplifier according to claim 2 is characterized in: that gates of first and second transistors whose sources are grounded form an input pair, to which a differential voltage is inputted; that the gate and drain of a third transistor are mutually connected; that drains of the above-described first, second and third transistors are mutually connected and are driven by a constant current; that a fourth transistor whose gate is mutually connected to the gate of the above-described first transistor, a fifth transistor whose gate is mutually connected to the gate of the above-described second transistor, and sixth and seventh transistors whose gates are mutually connected to the gate of the third transistor are mutually connected at sources and are driven by a constant current; that drains of the above-described fourth transistor and above-described sixth transistor are mutually connected and form one of a differential output pair; that drains of the above-described fifth transistor and above-described seventh transistor are mutually connected, and form the other of the differential output pair; and that each gate ratio (W/L) of the above-described sixth and seventh transistors is a half of a gate ratio (W/L) of the above-described third transistor.

A MOS linear transconductance amplifier according to claim 3 is characterized in that, in the MOS linear transconductance amplifier according to claim 2, sources of the above-described first, second and third transistors are mutually connected and are grounded through a resister or a diode that is formed by mutually connecting a gate and a source.

A MOS linear transconductance amplifier according to claim 4 is characterized in: that the MOS linear transconductance amplifier comprises first, second, third and forth transistors whose sources are mutually connected, and which are driven by a constant current; that a common voltage $V_{CM}$ of a differential input voltage is applied to the gate of the above-described first transistor; that gates of the above-described second and third transistors constitute an input pair, to which a differential voltage is inputted; that the gate and drain of the above-described fourth transistor are mutually connected; that the above-described second, third and fourth transistors are mutually connected at their drains and are driven by a constant current; that a fifth transistor whose gate is mutually connected to the gate of the above-described second transistor, a sixth transistor whose gate is mutually connected to the gate of the above-described third transistor, and seventh and eighth transistors whose gates are mutually connected to the gate of the fourth transistor are mutually connected at their sources and are driven by a constant current; that drains of the above-described fifth transistor and above-described seventh transistor are mutually connected and form one of a differential output pair; that drains of the above-described sixth transistor and above-described eighth transistor are mutually connected, and form the other of the differential output pair; and that each gate ratio (W/L) of the above-described seventh and eighth transistors is a half of a gate ratio (W/L) of the above-described fourth transistor.

A MOS linear transconductance amplifier according to claim 5 is characterized in that, in the MOS linear transconductance amplifier according to claim 4, wherein a current flowing in the above-described first transistor is a reference current, currents having predetermined mirror ratios are supplied to the common drain of the above-described second, third and fourth transistors, and one and the other of the above-described differential output pair respectively.

A MOS linear transconductance amplifier according to claim 6 or 7 is characterized in that, in the MOS linear transconductance amplifier according to claim 4 or 5, a common source voltage of the above-described first, second, third and fourth transistors is different from a common source voltage of the above-described fifth, sixth, seventh and eighth transistors.

A MOS linear transconductance amplifier according to claim 8 or 9 is characterized in that, in the MOS linear transconductance amplifier according to claim 4 or 5, sources of the above-described first, second, third, fourth, fifth, sixth, seventh and eighth transistors are mutually connected.

Next, in other words, the configuration of the MOS linear transconductance amplifier according to the present invention will be described once again. In the MOS linear transconductance amplifier according to the present invention, that gates of the first and second transistors whose sources are grounded constitute the input pair, the differential voltage is inputted to the input pair, and the gate and drain of the third transistor is mutually connected, the above-described first, second and third transistors are mutually connected at their drains, and are driven by the constant current. Furthermore, the MOS linear transconductance amplifier comprises means for adding a current flowing in the above-described first transistor to a current that is a half of a current flowing in the above-described third transistor, and means for adding the current flowing in the above-described second transistor to the current that is a half of the current flowing in the above-described third transistor, and these two sum currents are made to be differential output currents.

Alternatively, sources of the above-described first, second and third transistors are mutually connected and are grounded directly, or of through a resister or a diode that is formed by mutually connecting a gate and a source. Gates of the above-described first and second transistors constitute an input pair, to which the differential voltage is inputted. The gate and drain of the above-described third transistor are mutually connected. Furthermore, the above-described first, second and third transistors are mutually connected at their drains, and are driven by a constant current. The fourth transistor whose gate is mutually connected to the gate of the above-described first transistor, a fifth transistor whose gate is mutually connected to the gate of the above-described second transistor, and six and seventh transistors whose gates are mutually connected to the gate of the above-described third transistor are mutually connected at their sources and are driven by a constant current. Drains of the above-described fourth transistor and above-described sixth transistor are mutually connected and form one of a differential output pair. Drains of the above-described fifth transistor and above-described seventh transistor are mutually connected, and form the other of the differential output pair. Then, each gate ratio (W/L) of the above-described sixth and seventh transistors is a half of a gate ratio (W/L) of the above-described third transistor.

Alternatively, the MOS linear transconductance amplifier comprises first, second, third and forth transistors whose sources are mutually connected, and which are driven by the constant current. The common voltage of the differential input voltage is applied to the gate of the above-described first transistor. Gates of the above-described second and third transistors constitute an input pair, to which the differential voltage is inputted. The gate and drain of the above-described fourth transistor are mutually connected. Furthermore, the above-described second, third and fourth transistors are mutually connected at their drains, and are driven by the constant current. A fifth transistor whose gate is mutually connected to the gate of the above-described second transistor, a sixth transistor whose gate is mutually connected to the gate of the above-described third transistor, seventh and eighth transistors whose gates are mutually connected to the gate of the fourth transistor are mutually connected at their sources and are driven by a constant current. Drains of the above-described fifth transistor and above-described seventh transistor are mutually connected and form one of the differential output pair. Drains of the above-described sixth transistor and above-described eighth transistor are mutually connected, and form the other of the differential output pair. In addition, each gate ratio (W/L) of the above-described seventh and eighth transistors is a half of the gate ratio (W/L) of the above-described fourth transistor.

The MOS linear transconductance amplifier including a current mirror circuit, wherein the current flowing in the above-described first transistor is the reference current, currents having predetermined mirror ratios are supplied to the common drain of the above-described second, third and fourth transistors, and one and the other of the above-described differential output pair, respectively.

Next, with changing words, an operation of the MOS linear transconductance amplifier according to the present invention will be described once again. As a method of obtaining a straight line from a curve with the square-law characteristics is generally called a parabolic characteristics, there is a method of using a class A operation obtained by adding square characteristics to the parabolic characteristics besides a class AB operation obtained by reducing the parabolic characteristics from the parabolic characteristics. Since it is possible to configure a circuit without including a p-channel transistor on a signal path in case of current addition procedure, improvement in its frequency characteristic can be estimated.

DETAILED DESCRIPTION OF THE PREFERRED EMBODIMENTS

Figure 1:
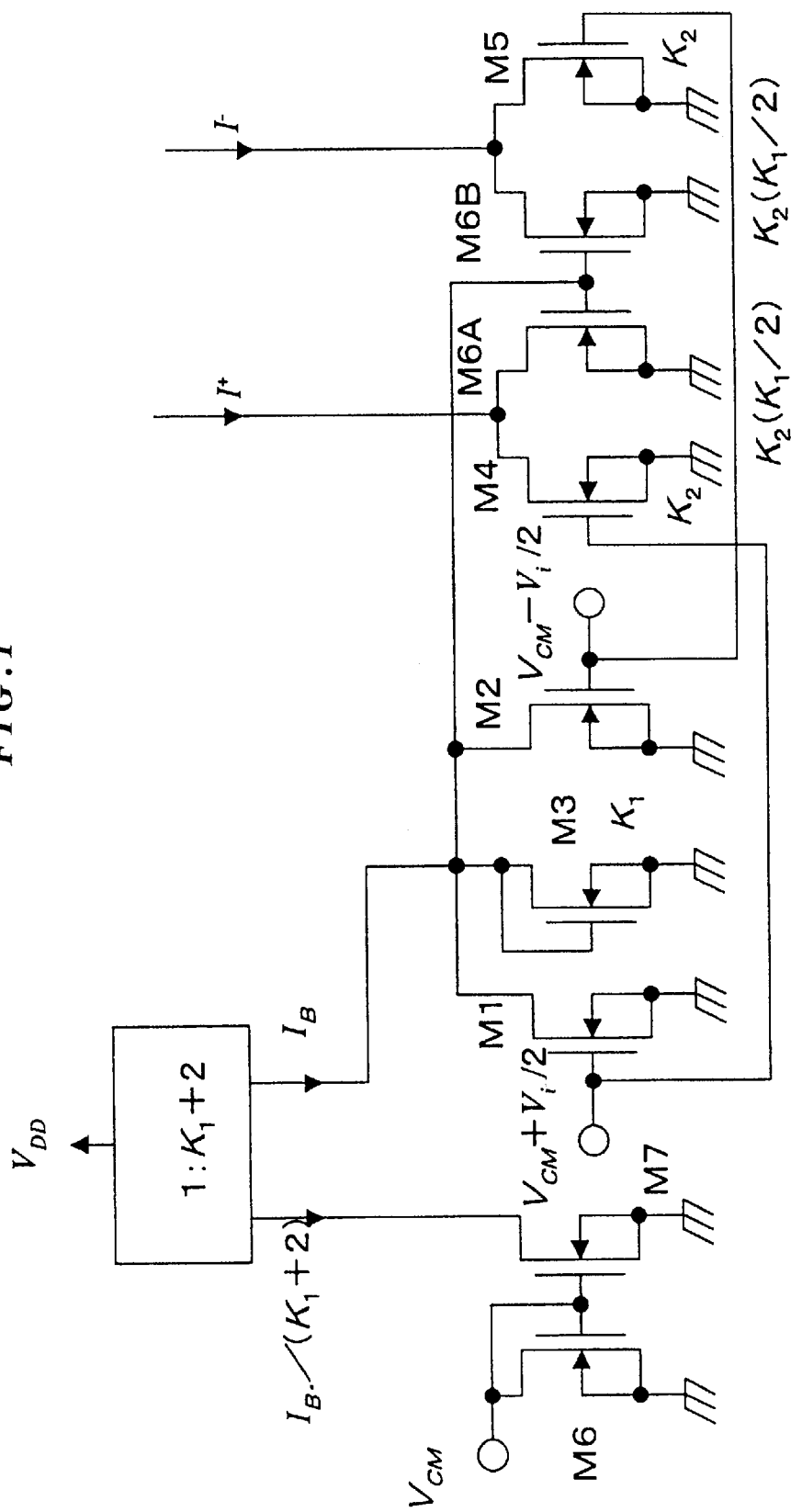
FIG. 1 is a circuit diagram showing an embodiment of the linear transconductance amplifier according to claim 1.

FIG. 1 is a circuit diagram showing an embodiment of a MOS linear transconductance amplifier according to claim 1.

Transistors M6 and M7 whose sources are grounded constitutes a current mirror circuit for setting a bias current. Here, a current flowing in the unit transistor M7 is a reference current of another current mirror circuit (mirror ratio is 1:$K_1$+2) when the input common mode voltage $V_{CM}$ is applied. In transistors M1 to M3 whose sources are grounded, the transistors M1 and M2 are unit transistors. It is assumed that a gate ratio (W/L) of the transistor M3 is $K_1$ time as large as that of the unit transistor. Two gates of transistors M1 and M2 constitute a differencial input pair, and a gate and drain of the transistor M3 is connected each other. Furthermore, the transistors M1 to M3 are mutually connected at their drains, and are driven by a constant current $I_B$.

Drain currents of respective transistors M1, M2 and M3 at this time are shown as follows:

$$I_{D1} = \beta\left(V_{CM} + \frac{V_i}{2} - V_{TH}\right)^2 \quad (57)$$

$$I_{D2} = \beta\left(V_{CM} - \frac{V_i}{2} - V_{TH}\right)^2 \quad (58)$$

$$I_{D3} = K_1\beta(V_{CM}+V_C-V_{TH})^2 \quad (59)$$

Here, since these transistors are driven by the constant current $I_B$, the following formula is satisfied:

$$I_{D1}+I_{D2}+I_{D3}=I_B \quad (60)$$

Here, if the bias current $I_B$ is set so as to be $V_C$=0 when $V_i$=0, a following formula is obtained:

$$\beta(V_{CM} - V_{TH})^2 = \frac{I_B}{K_1 + 2} \quad (62)$$

With solving formula ($V_{CM}$+$V_C$−$V_{TH}$) through substituting the formulas (57) to (59) for the formula (60) and replacing it with the formula (62), the following formula can be obtained:

$$V_{CM} + V_C - V_{TH} = \frac{1}{\sqrt{K_1}} \sqrt{\frac{K_1}{K_1+2} \frac{I_B}{\beta} - \frac{1}{2} V_i^2} \quad \left(|V_i| \le \sqrt{\frac{K_1}{K_1+2} \frac{I_B}{\beta}}\right) \quad (63)$$

Hence, the voltage $V_C$ can be obtained as follows:

$$V_C = -\sqrt{\frac{1}{K_1+2} \frac{I_B}{\beta}} + \sqrt{\frac{1}{K_1+2} \frac{I_B}{\beta} - \frac{V_i^2}{2K_1}} \quad \left(|V_i| \le \sqrt{\frac{K_1}{K_1+2} \frac{I_B}{\beta}}\right) \quad (64)$$

Here, $V_c \le V_{CM}$

Furthermore, if $K_1$ can be equally divided into two $K_1/2$, the linear differential currents can be obtained as follows:

$$I_{D1} + \frac{I_{D3}}{2} = \frac{I_B}{2} + \sqrt{\frac{\beta I_B}{K_1+2}} V_i \quad \left(|V_i| \le \sqrt{\frac{K_1}{K_1+2} \frac{I_B}{\beta}}\right) \quad (65)$$

$$I_{D2} + \frac{I_{D3}}{2} = \frac{I_B}{2} - \sqrt{\frac{\beta I_B}{K_1+2}} V_i \quad \left(|V_i| \le \sqrt{\frac{K_1}{K_1+2} \frac{I_B}{\beta}}\right) \quad (66)$$

Therefore, the MOS linear transconductance amplifier is realizable using MOS transistors M4 to M6A and M6B. That is, sources of transistors M4 to M6A and M6B is grounded. And MOS transistors M4 to M6A and M6B share gate voltages with the transistors M1 to M3, respectively. Additionally, the drains of the transistors M4 and M6A are mutually connected, the drains of the transistors M5 and M6B are mutually connected, and these drains constitutes a differential output pair. Thus, the MOS linear transconductance amplifier is realizable Here, an important thing is that, even if a transistor size of the transistor M3 is set to an arbitrary value, the MOS linear transconductance amplifier is realizable. Moreover, if the gate ratios of the transistors M4 and M5 is set to $K_2$ times as large as that of a unit transistor and the gate ratios of the transistors M6A and M6B is set to $(K_1/2)K_2$ times as large as that of the unit transistor, it is possible to make the output current be $K_2$ times of the current value shown in the formulas (65) and (66) as follows:

$$I^+ = I_{D4} + I_{D6A} = \frac{K_2 I_H}{2} + K_2 \sqrt{\frac{\beta I_B}{K_1+2}} V_i \quad \left(|V_i| \le \sqrt{\frac{K_1}{K_1+2} \frac{I_B}{\beta}}\right) \quad (67)$$

$$I^- = I_{D5} + I_{D6B} = \frac{K_2 I_H}{2} - K_2 \sqrt{\frac{\beta I_B}{K_1+2}} V_i \quad \left(|V_i| \le \sqrt{\frac{K_1}{K_1+2} \frac{I_B}{\beta}}\right) \quad (68)$$

Therefore, the MOS linear transconductance amplifier can be realized. Here, a noteworthy thing is that, even if the transistor size of the transistor M3 is set to an arbitrary value, the MOS linear transconductance amplifier is realizable. Moreover, a consumption current in a control voltage generating circuit can be made lower than a consumption current in an output circuit by setting $K_2$ to be $K_2>2/(K_1+2)+1$. An operation of a circuit with such an output circuit is called a class A operation. In addition, it is possible to realize an OTA (operational transconductance amplifier) by driving the drains of the transistors M4 and M6A, which are mutually connected, and the drains of the transistors M5 and M6B, which are mutually connected with a constant current $2K_2I_B/(K_1+2)$ respectively.

Moreover, as for the value of $K_1$, $K_1=2$ from which the value of $K_1/2$ becomes a unit transistor seems to be reasonable on the basis of a conventional circuit analysis. However, actually, $K_1$ is set in a range of $1 \le K_1 \le 2$ so as to become $V_c = V_{CM}$ at $V_i = 0$ by reducing a value of the bias current $I_B$. On the other hand, gate ratios of the transistors M6A and M6B were set to be $K_2$ times as large as that of the unit transistor. It is understood that this case further increases linearity according to a simulation. It is considered that this is caused by a fact that a power value small than a value coming from the square-law, for example, the power of 1.5 generates an error smaller than the value coming from the square-law in the case of approximating an entire operational current range since a gradient gradually decreases as the drain current increase in the MOS transistor although this assumes the square-law of a MOS transistor in circuit analysis and the formula is solved. In this case, a unit transistor must be made to be a transistor larger than the minimum transistor in a design rule, and must enable to realize a transistor smaller than a unit transistor.

Next, it will be described that a MOS linear transconductance amplifier is also realizable by making transistors M1 to M3 and transistors M4 to M6A and M6B, which share gate voltages with transistors M1 to M3 respectively, floated through driving the transistors M1 to M3 and transistors M4 to M6A and M6B with a constant current, and making the transistors M4 and M6A, and transistors M5 and M6B be a differential output pair through mutually connecting drains of the transistors M4 and M6A, and mutually connecting drains of the transistors M5 and M6B.

Figure 2:
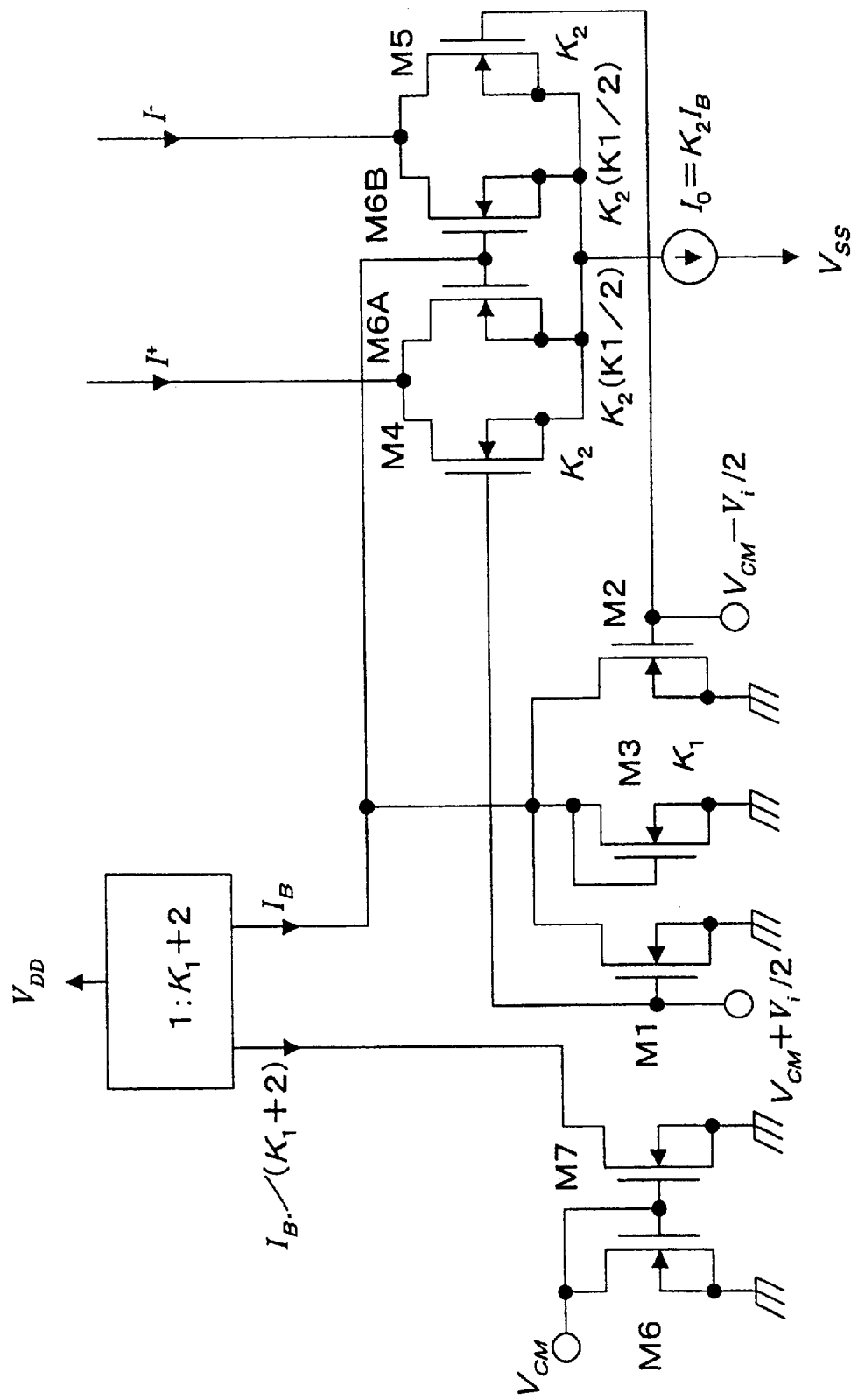
FIG. 2 is a circuit diagram showing an embodiment of the linear transconductance amplifier according to claim 2.

FIG. 2 is an example of a circuit showing an embodiment of the MOS linear transconductance amplifier according to claim 2.

It is assumed that each gate ratio (W/L) of transistors M4 and M5 is $K_2$ times as large as that of a unit transistor and each gate ratio (W/L) of the transistors M6A and M6B is $K_2(K_1/2)$ times as large as that of the unit transistor. With letting $K_2$ be $K_2 \ge 1$, it is possible to arrange a constant current source between a common source of the transistors M4 to M6A and M6B, and a negative power supply $-V_{ss}$. A symbol $I_0$ denotes a value of a constant current driving the transistors M4 to M6A and M6B whose sources are mutually connected.

Drain currents of respective transistors at this time are expressed as follows:

$$I_{D4} = K_2 \beta \left(V_{CM} + \frac{V_{in}}{2} - V_{S2} - V_{TH}\right)^2 \quad (69)$$

$$I_{D5} = K_2 \beta \left(V_{CM} - \frac{V_{in}}{2} - V_{S2} - V_{TH}\right)^2 \quad (70)$$

$$I_{D6A} = I_{D6B} = K_2 \frac{K_1}{2} \beta (V_{CM} + V_C - V_{S2} - V_{TH})^2 \quad (71)$$

Since each transistor is driven by a constant current $I_0$, the following formula is satisfied:

$$I_{D4} + I_{D5} + I_{D6A} + I_{D6B} = I_O \quad (72)$$

A following formula can be obtained by solving ($V_{CM}-V_{S2}-V_{TH}$) through substituting the formulas (69) to (71) for the formula (72):

$$V_{CM} - V_{S2} - V_{TH} = \frac{-K_1 V_C + \sqrt{\frac{K_1+2}{K_2} \frac{I_0}{\beta} - \frac{K_1+2}{2} V_i^2 - 2K_1 V_C^2}}{K_1+2} \quad (73)$$

Here, in order for this MOS lenear transconductance amplifier performs the linear operation, the common source voltage must be a constant voltage, and it necessary to satisfying a following formula:

$$-K_1 V_C + \sqrt{\frac{K_1+2}{K_2}\frac{I_0}{\beta} - \frac{K_1+2}{2}V_i^2 - 2K_1 V_C^2} = c(constant) \quad (74)$$

A following formula can be obtained by solving $V_c$ from the formula (74).

$$V_C = \frac{-K_1 c + \sqrt{\frac{K_1(K_1+2)^2}{K_2}\frac{I_0}{\beta} - \frac{K_1(K_1+2)^2}{2}V_i^2 - 2K_1 c^2}}{K_1(K_1+2)} \quad (75)$$

Here, since $V_c$=0 at $V_i$=0, in a case of a following formula is satisfied:

$$c^2 = \frac{K_1+2}{K_2}\frac{I_0}{\beta} \quad (76)$$

Then, a following formula can be obtained.

$$V_C = -\sqrt{\frac{1}{K_2(K_1+2)}\frac{I_0}{\beta}} + \sqrt{\frac{1}{K_2(K_1+2)}\frac{I_0}{\beta} - \frac{1}{2K_1}V_i^2} \quad (77)$$

$$\left(|V_i| \leq \sqrt{\frac{K_1}{K_2(K_1+2)}\frac{I_0}{\beta}}\right)$$

Similarly to the case of obtaining the formula (47), $V_c$ becomes a control voltage for performing the linear operation.

Hence, this formula (77) should just become equal to the formula (64). Thus, in order to satisfy this condition, it is necessary to satisfy the formula (78).

$$\frac{1}{K_1+2}\frac{I_B}{\beta} = \frac{1}{K_2(K_1+2)}\frac{I_0}{\beta} \quad (78)$$

Therefore, a conditional formula for performing the linear operation can be obtained as follows:

$$I_0 = K_2 I_B \quad (79)$$

Figure 3:
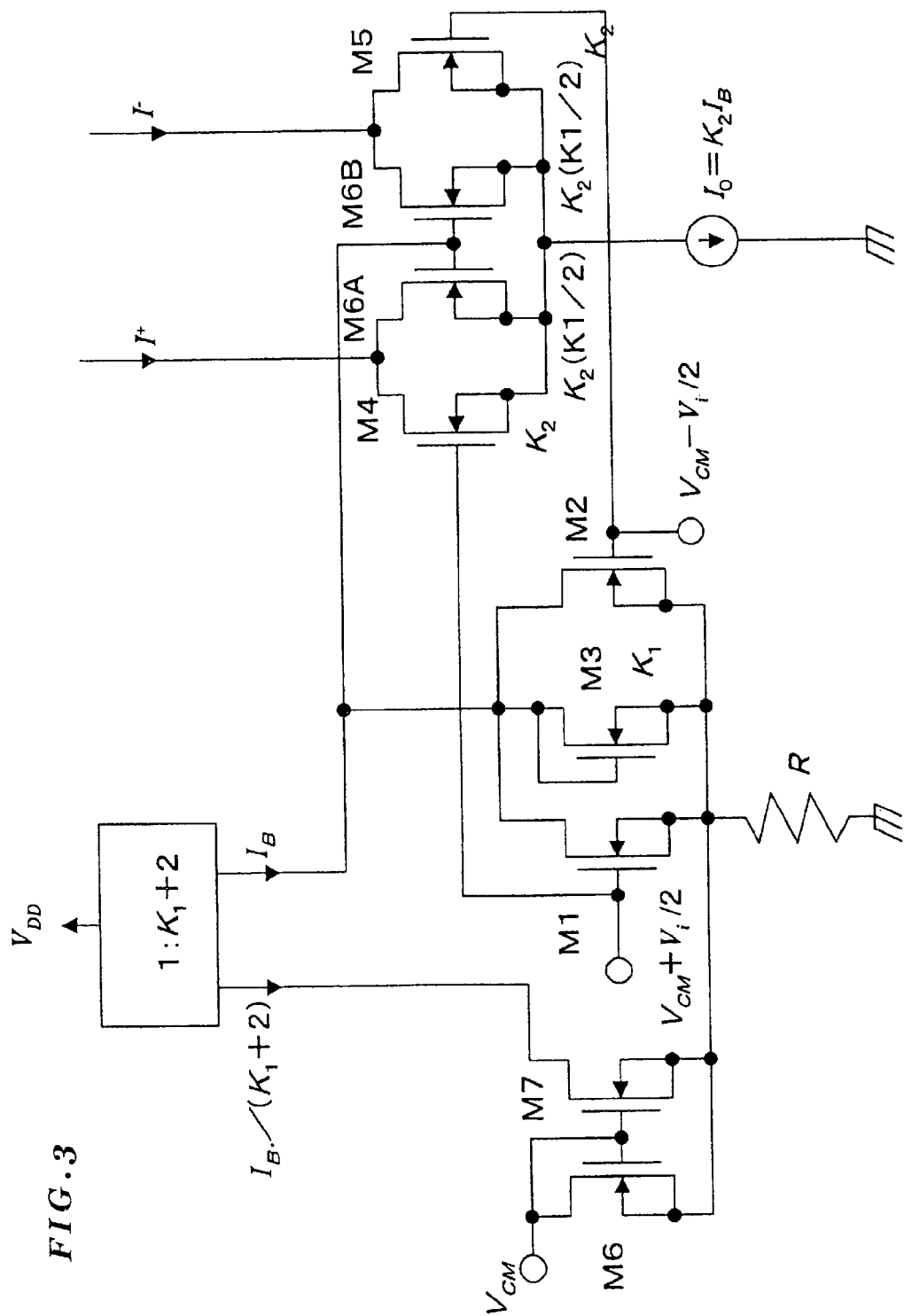
FIG. 3 is a circuit diagram showing an embodiment of the linear transconductance amplifier according to claim 3.

For example, if $K_2$ is 2 then $I_0$=$2I_B$, and if $K_2$ is 4 then $I_0$=$4I_B$. However, in this condition, a voltage difference between a common source and the ground is not produced. It is because the voltage between the gate and source of each transistor does not change if the drive current is also $K_2$ times even if each transistor size of the control voltage generating circuit is made to be $K_2$ times. Hence, as shown in FIG. 2, it is understood that the constant current source $I_0$ should be arranged between a common source and negative power supply $-V_{ss}$. Alternatively, as shown in FIG. 3, a constant current flows in a resistor R by inserting resistor R between the common source of transistors M1 to M3, M6 and M7, and the ground. Hence, it is possible to set the voltage between the common source of transistors M1 to M3, M7 and M8 and the ground to be a constant value, and to arrange the constant current source between the common source and ground. Alternatively, it is also preferable to insert a transistor, having diode connection obtained by mutually connecting its gate and drain, instead of the resistor R.

An output current at this time is as follows:

$$I^+ = I_{D4} + I_{D6A} = K_2 I_B + K_2 \sqrt{\frac{\beta I_B}{K_1+2}} V_i \left(|V_i| \leq \sqrt{\frac{K_1 I_B}{(K_1+2)\beta}}\right) \quad (80)$$

$$I^- = I_{D5} + I_{D6B} = K_2 I_B - K_2 \sqrt{\frac{\beta I_B}{K_1+2}} V_i \left(|V_i| \leq \sqrt{\frac{K_1 I_B}{(K_1+2)\beta}}\right) \quad (81)$$

Hence, the MOS linear transconductance amplifier is realizable. Here, a noteworthy thing is that, even if the transistor size of the transistor M3 is set to an arbitrary value, the MOS linear transconductance amplifier is realizable. Moreover, a current consumed in the control voltage generating circuit can be made lower than a current consumed in the output circuit by setting $K_2$ as $K_2>2/(K_1+2)+1$. An operation of a circuit with such an output circuit form is called a class A operation. In addition, the OTA (operational transconductance amplifier) is realizable by driving the common drain of transistors M4 and M6A, and the common drain of transistors M5 and M6B with constant currents $K_2 I_B$, respectively.

In each MOS linear transconductance amplifier described above, a linear operation input voltage range and a transconductance are determined with the drive currents of the control voltage generating circuit, and transconductance parameters of transistors. It is desired that the transconductance is variable in the MOS linear transconductance amplifier. For that purpose, it is necessary to make the transistors M1 to M3, which constitute a control voltage generating circuit and have the grounded sources, floating and driving them with the constant current source.

Figure 4:
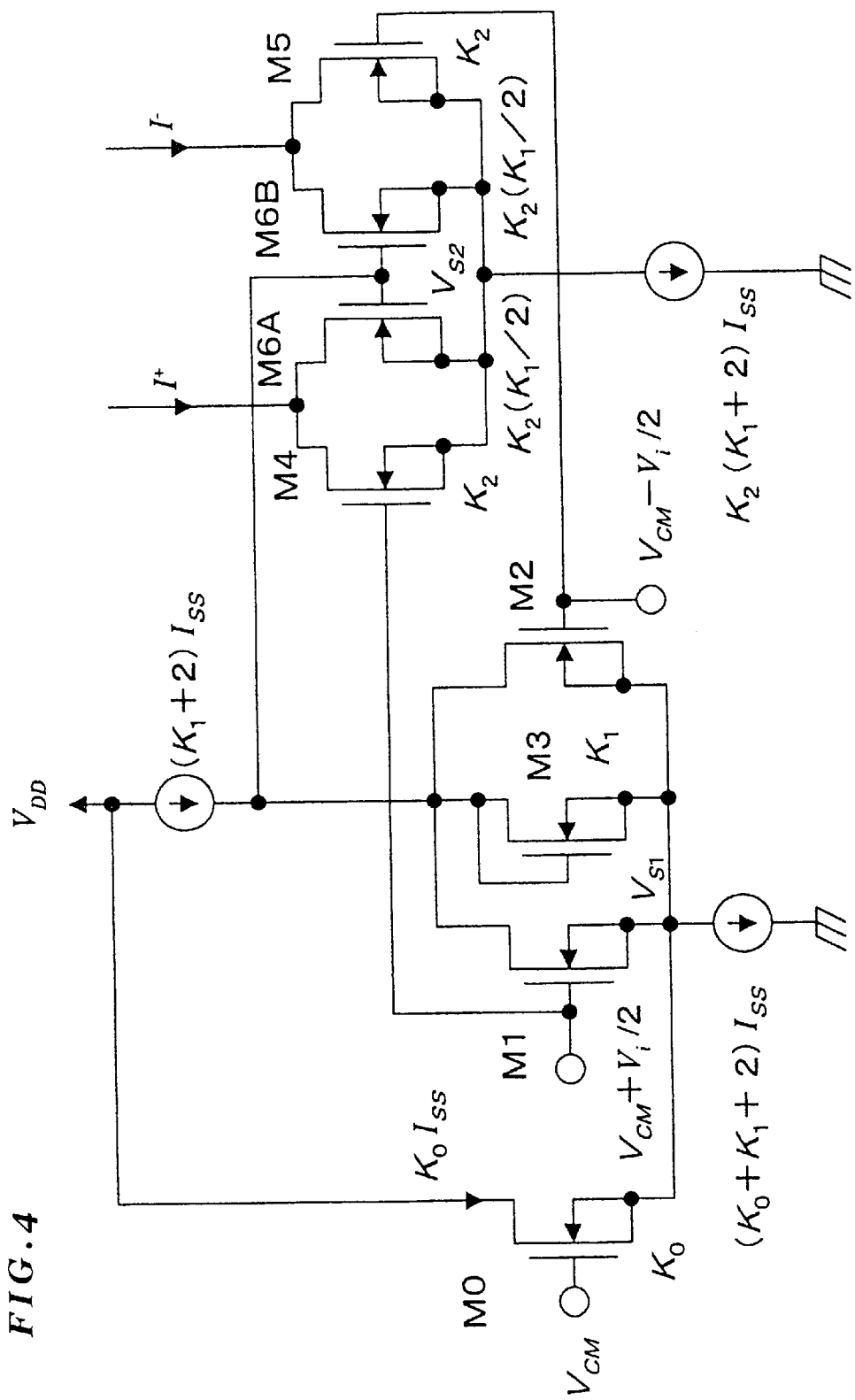
FIG. 4 is a circuit diagram showing an embodiment of the linear transconductance amplifier according to claim 4.

FIG. 4 is an example of a circuit showing an embodiment of a MOS linear transconductance amplifier according to claim 4.

Here, sources of the transistors M1 to M3 are mutually connected and their drains are also mutually connected. Hence, so as to normally operate, it is necessary to set a common source voltage value. As a method of setting a common source voltage value, it is common to add a transistor M0, to apply a gate voltage to the transistor M0, to perform a level shift with a voltage between its gate and source, and to make it be a common source voltage. What is necessary is to consider as the input common mode voltage $V_{CM}$, and just to consider transistor M0 as a constant current drive as volt age applied to the gate of transistor M0, since differential voltage is inputted into a control voltage generating circuit.

Here, supposing that a gate ratio (W/L) of the transistor M0 is $K_0$ times as large as that of the unit transistor. In addition, a current $I_{ss}$ independent of the input common mode voltage $V_{CM}$ is introduced. The transistors M1 to M3 whose drains are mutually connected and are driven by a constant current $(K_1+2)I_{ss}$. Supposing that a constant current $K_0 I_{ss}$ flows in the transistor M0, the transistors M0 to M3 are mutually connected at their sources, and are driven by a constant current $(K_0+K_1+2)I_{ss}$. Here, since the current flowing in the transistor M0 is a value obtained by subtracting the currents, flowing in the transistors M1 to M3 from the drive current $(K_0+K_1+2)I_{ss}$, it is not necessary to drive it by the constant current $K_0 I_{ss}$ from the drain side of transistor $M_0$.

At this time, $I_{D0}$ is as follows:

$$I_{D0} = K_0 I_{ss} = K_0 \beta (V_{CM} - V_{S1} - V_{TH})^2 \quad (82)$$

Hence, the common source voltage $V_{S1}$ is obtained as follows:

$$V_{S1} = V_{CM} - \sqrt{\frac{I_{SS}}{\beta}} - V_{TH} \tag{83}$$

Drain currents of respective transistors at this time are shown as follows:

$$I_{D1} = \beta\left(V_{CM} + \frac{V_i}{2} - V_{S1} - V_{TH}\right)^2 \tag{84}$$

$$I_{D2} = \beta\left(V_{CM} - \frac{V_i}{2} - V_{S1} - V_{TH}\right)^2 \tag{85}$$

$$I_{D3} = K_1\beta(V_{CM}+V_C-V_{S1}-V_{TH})^2 \tag{86}$$

Since these transistors are driven by the constant current $(K_1+2) I_{ss}$, the following formula is satisfied:

$$I_{D1}+I_{D2}+I_{D3}=(K_1+2)I_S \tag{87}$$

With solving $(V_{CM}-V_{S1}-V_{TH})$ through substituting the formulas (84) to (86) for the formula (87), the following formula can be obtained:

$$V_{CM} - V_{S1} - V_{TH} = \frac{-K_1 V_C + \sqrt{(K_1+2)^2 \frac{I_{SS}}{\beta} - \frac{K_1+2}{2}V_i^2 - 2K_1 V_C^2}}{K_1+2} \tag{89}$$

Here, with substituting the formula (83) into the formula (89), the following formula can be obtained:

$$\sqrt{\frac{I_{SS}}{\beta}} = \frac{-K_1 V_C + \sqrt{(K_1+2)^2 \frac{I_{SS}}{\beta} - \frac{K_1+2}{2}V_i^2 - 2K_1 V_C^2}}{K_1+2} \tag{90}$$

With solving this formula about $V_c$, the following formula can be obtained:

$$V_C = -\sqrt{\frac{I_{SS}}{\beta}} + \sqrt{\frac{I_{SS}}{\beta} - \frac{1}{2K_1}V_i^2} \quad \left(|V_i| \le \sqrt{K_1 \frac{I_{SS}}{\beta}}\right) \tag{91}$$

With substituting the formulas (83) and (91) into the formulas (84) to (86), the following formulas can be obtained:

$$I_{D1} = \frac{\beta}{4}V_i^2 + \sqrt{\frac{I_{SS}}{\beta}} V_i + I_{SS} \quad \left(|V_i| \le \sqrt{K_1 \frac{I_{SS}}{\beta}}\right) \tag{92}$$

$$I_{D2} = \frac{\beta}{4}V_i^2 - \sqrt{\frac{I_{SS}}{\beta}} V_i + I_{SS} \quad \left(|V_i| \le \sqrt{K_1 \frac{I_{SS}}{\beta}}\right) \tag{93}$$

$$I_{D3} = K_1 I_{SS} - \frac{\beta}{2}V_i^2 \quad \left(|V_i| \le \sqrt{K_1 \frac{I_{SS}}{\beta}}\right) \tag{94}$$

Furthermore, if $K_1$ can be equally divided into two $K_1/2$, the following formulas can be obtained:

$$I_{D1} + \frac{I_{D3}}{2} = \left(1 + \frac{K_1}{2}\right)I_{SS} + \sqrt{\frac{I_{SS}}{\beta}} V_i \quad \left(|V_i| \le \sqrt{K_1 \frac{I_{SS}}{\beta}}\right) \tag{95}$$

$$I_{D2} + \frac{I_{D3}}{2} = \left(1 + \frac{K_1}{2}\right)I_{SS} - \sqrt{\frac{I_{SS}}{\beta}} V_i \quad \left(|V_i| \le \sqrt{K_1 \frac{I_{SS}}{\beta}}\right) \tag{96}$$

Hence, a linear differential current can be obtained.

Here, a noteworthy thing is that, also in the case that a transistor size of the transistor M3 is set to an arbitrary value, the MOS linear transconductance amplifier is realizable. Hence, the MOS linear transconductance amplifier is realizable by making transistors M1 to M3 and transistors M4 to M6A and M6B, which share gate voltages with transistors M1 to M3 respectively, be a differential output pair through mutually connecting drains of the transistors M4 and M6A, and mutually connecting drains of the transistors M5 and M6B.

Here, in the case of that the gate rations of each transistors M4 and M5 set to $K_2$ times as large as that of a unit transistor, gate ratios of the transistors M6A and M6B set to $(K_1/2)K_2$ times as large as that of the unit transistor, and the drive current set to $K_2$ times, it is possible to make a $K_2$ times output current of a current value shown in the formulas (95) and (96) as follows:

$$I^+ = I_{D4} + I_{D6A} = K_2\left(1 + \frac{K_1}{2}\right)I_{SS} + K_2\sqrt{\frac{I_{SS}}{\beta}} V_i \quad \left(|V_i| \le \sqrt{K_1 \frac{I_{SS}}{\beta}}\right) \tag{97}$$

$$I^- = I_{D5} + I_{D6B} = K_2\left(1 + \frac{K_1}{2}\right)I_{SS} - K_2\sqrt{\frac{I_{SS}}{\beta}} V_i \quad \left(|V_i| \le \sqrt{K_1 \frac{I_{SS}}{\beta}}\right) \tag{98}$$

Hence, the MOS linear transconductance amplifier is realizable. Here, a noteworthy thing is that it is not necessary to make all of four transistors M4 to M6A and M6B equal size. Moreover, a linear input voltage range can be also extended by setting the transistor size of the transistor M3 to be larger. However, it is necessary to set current per-unit-area (current density) flowing in the transistors M1 to M3 at the time of a non-signal ($V_i$=0) to be an equal constant value. Moreover, a current consumed in the control voltage generating circuit can be made lower than a current consumed in the output circuit by setting $K_2$ as $K_2 > K_0/(K_1+2)+1$.

An operation of a circuit with such an output circuit form is called class A operation. In addition, OTA (operational transconductance amplifier) is realizable by driving the common drain of transistors M4 and M6A, and the common drain of transistors M5 and M6B with constant currents $K_2(1+K_1/2)I_{ss}$, respectively.

Thus, desired currents are already generated in the control voltage generating circuit for supplying the gate voltages required in order to operate four transistors with the class A transistors. Hence, it is understood that, by changing the output of a transistor in the same circuit as this control voltage generating circuit, the MOS linear transconductance amplifier is realized.

Figure 5:
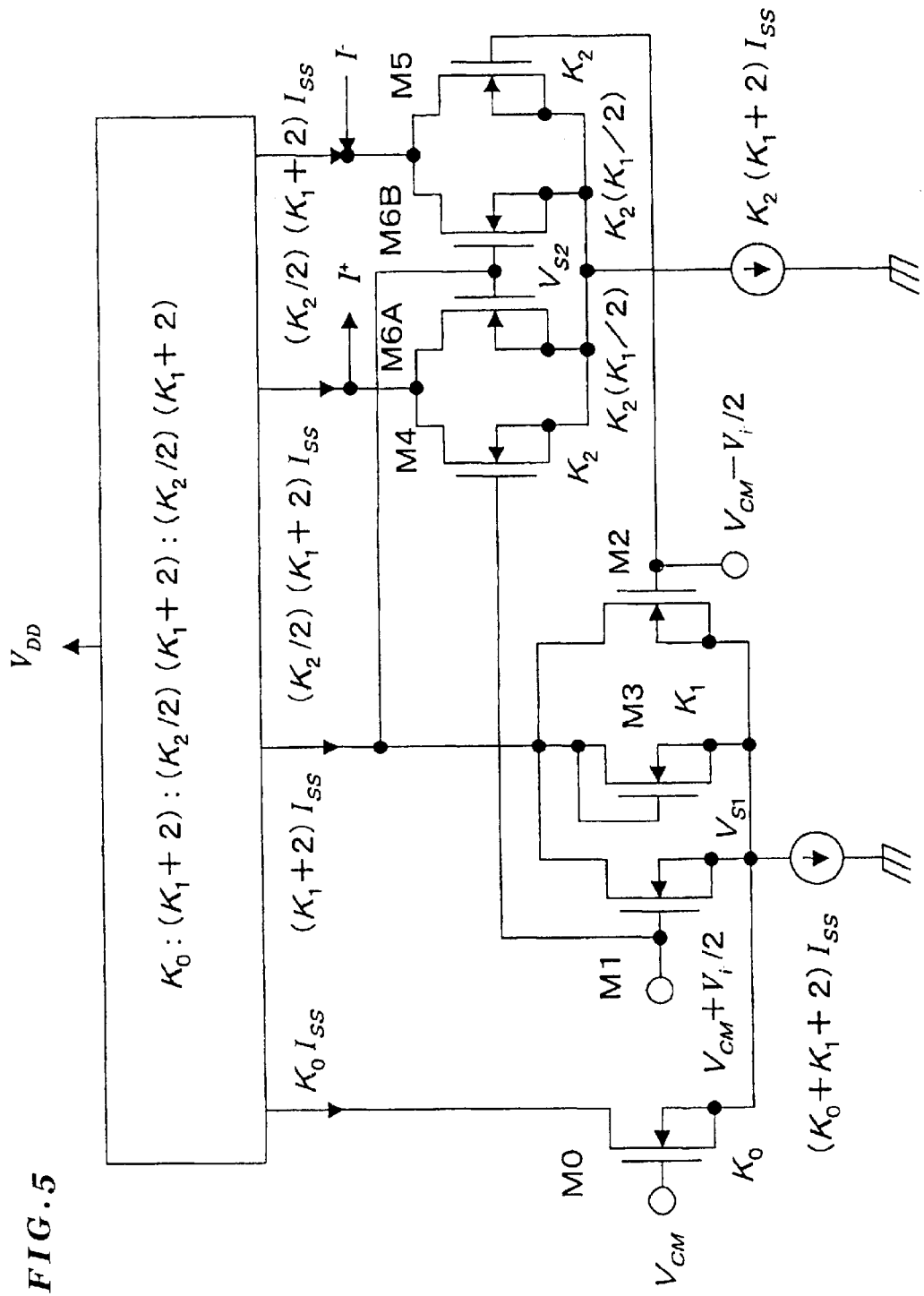
FIG. 5 is a circuit diagram showing an embodiment of the linear transconductance amplifier according to claim 5.

FIG. 5 is a circuit diagram showing an embodiment of a MOS linear transconductance amplifier according to claim 5.

Thus, in the OTA where each common source of a control voltage generating circuit and an output circuit is made to be floated, a transconductance is proportional to the square root of a driving current. Therefore, it is generally that the transconductance is set at a desired value by adjusting the driving current. Hence, it is required that currents supplied to drains of transistors from a power supply line is equally interlocked to currents supplied to the ground from common sources change the transconductance.

Here, when supplying currents to the ground from the common sources, or when supplying currents to the drains of transistors from the power supply line, the currents are supplied through a current mirror circuit. Hence, it is possible to supply currents with desired current ratio even if two or more current supplies are used. However, it is troublesome to interlock the current mirror circuit in the ground side with that in the power supply side. Configuration of only one of two mirror circuits is simpler by several steps and can make the current ratio more accurate.

Hence, as shown in FIG. 5, by letting the current, flowing in the transistor M0, be a reference current of the current mirror circuit, supplying currents, flowing into respective common drains of the transistors M1 to M3, transistors M4 and M6A, and transistors M5 and M6B, in a current ratio from the current mirror circuit, setting the current ratio to be $(K_1+2)/K_0$, $K_2(1+K_1/2)/K_0$ and $K_2(1+K_1/2)/K_0$ respectively, and changing currents with setting the current ratio of two current sources in the ground side to be $(K_0+K_1+2):K_2(K_1+2)$, simultaneously, desired currents whose current ratio is $K_0:(K_1+2):K_2(1+K_1/2):K_2(1+K_1/2)$ are automatically supplied from the current mirror circuit in the power supply side.

Here, it is also possible to put a linear operating input voltage range into the desired voltage range by positively changing parameters so that the common source voltage $V_{s1}$ of a first cell constituting the control voltage generating circuit differs from the common source voltage $V_{s2}$ of a second cell constituting the output circuit without making the common source voltage $V_{s1}$ of the first cell, constituting the control voltage generating circuit, and the common source voltage $V_{s2}$ of the second cell, constituting the output circuit, as shown in FIGS. 4 and 5.

As described above, it is also considered that a power value smaller than a value coming from the square-law, for example, the power of 1.5 generates an error smaller than the value coming from the square-law in the case of approximating an entire operational current range since a gradient gradually decreases as the drain current increase in the MOS transistor although this assumes the square-rule of a MOS transistor in circuit analysis and the formula is solved.

Alternatively, a secondary effect disregarded in the above circuit analysis is a factor for degrading the linearity of a linear transconductance amplifier. For example, as the secondary effect, a channel length modulation and the like notably appear. Hence, with citing an example, it is also possible to set the output voltage $V_c$ of the control voltage generating circuit so that the degradation of linearity may not become especially large even when an input voltage is comparatively high while allowing such a status that some extent of degradation of the linearity may arise when the input voltage is comparatively low.

In general, as expressed in the formulas (64), (77) and (91), since the output voltage $V_c$ of the control voltage generating circuit is expressed in a form where the square value of the input voltage $V_i$ is subtracted in the root (square root), the output voltage $V_c$ can be approximated as follows:

$$V_C \approx -b + b\sqrt{1 - \frac{V_i^2}{a}} = -b\left(1 - \frac{1}{\sqrt{a}}\right)V_i^2 \quad (99)$$

This is a quadric curve (downward parabola) having a form like turning a bowl down. For example, suppose that it is better that the control voltage is as follows:

$$V_c = -cV_1^{1.5} \quad (100)$$

In approximating by the control voltage expressed with a formula (99), it shares zero point at the time of a non-signal ($V_i=0$). It is considerable to maintain the linearity over a comparatively high input voltage range by setting parameters so that the value of the formula (99) may be larger than the value of the formula (100) in a range where the input voltage is low, both values may become equal again when the input voltage becomes a considerably high value, and the value of the formula (100) may become larger than the value of the formula (99) in an input voltage range that is further high and is beyond this intersection.

Figure 6:
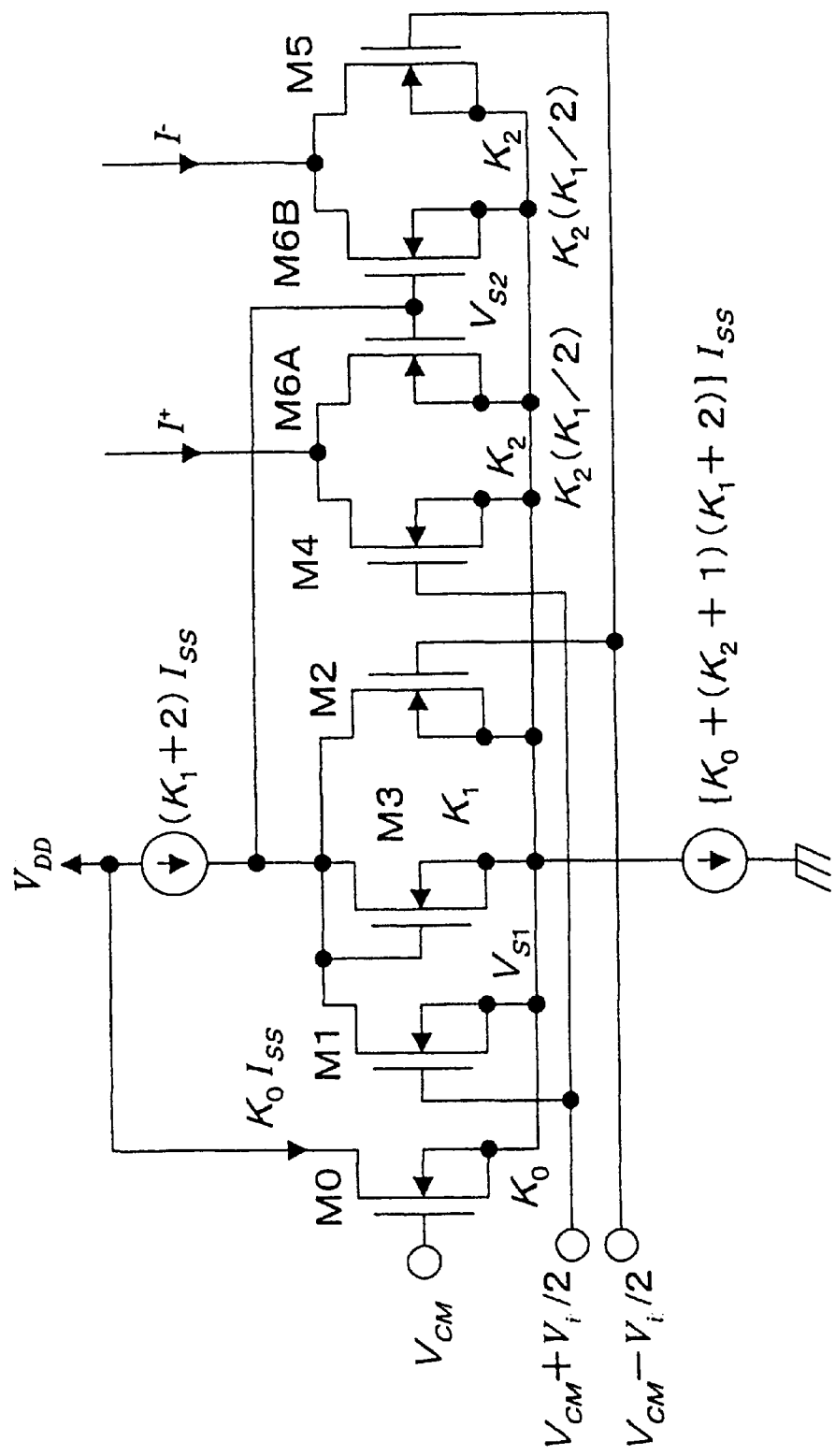
FIG. 6 is a circuit diagram showing an embodiment of the linear transconductance amplifier according to claim 7.
Figure 7:
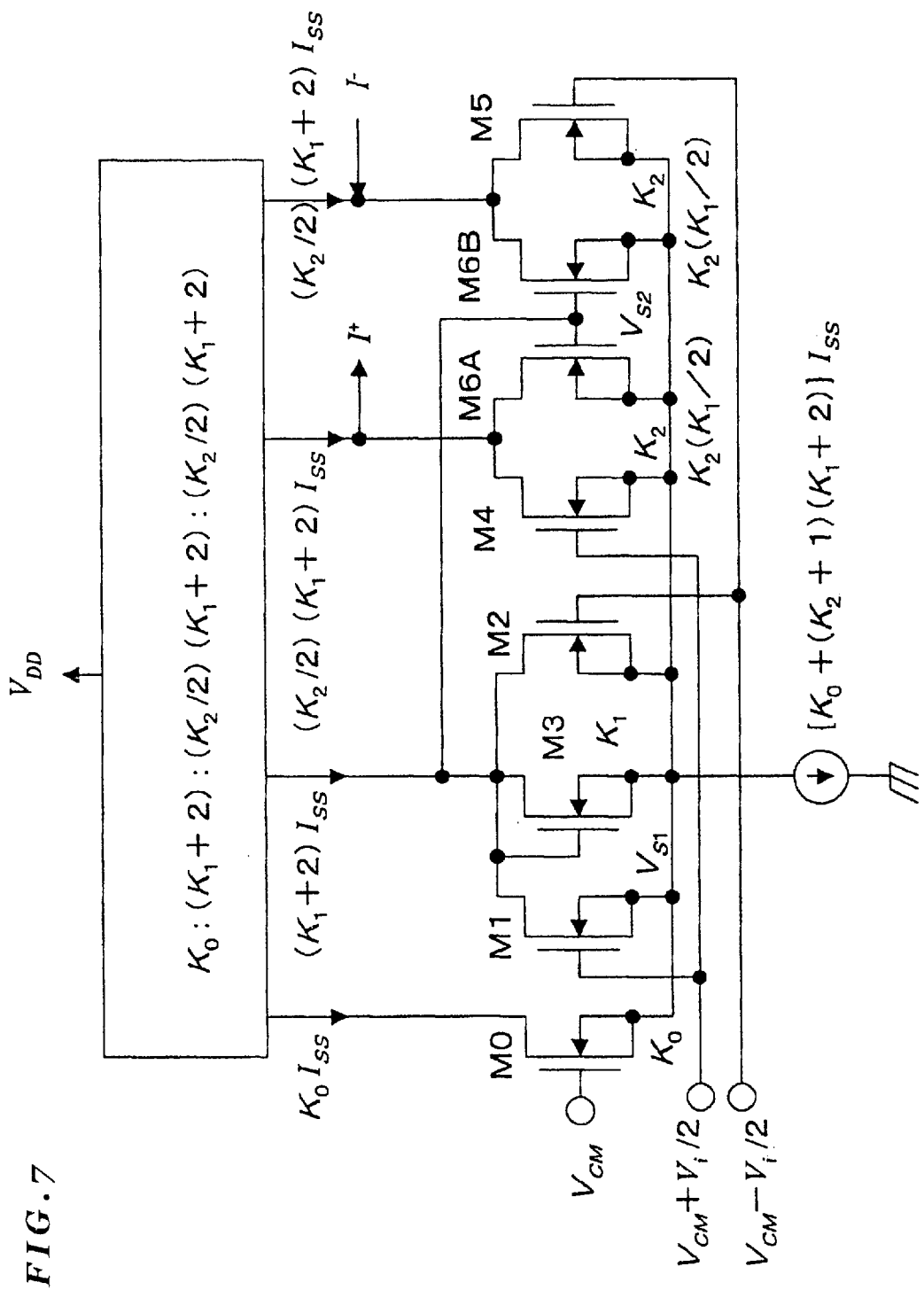
FIG. 7 is a circuit diagram showing another embodiment of the linear transconductance amplifier according to claim 7.
Figure 8:
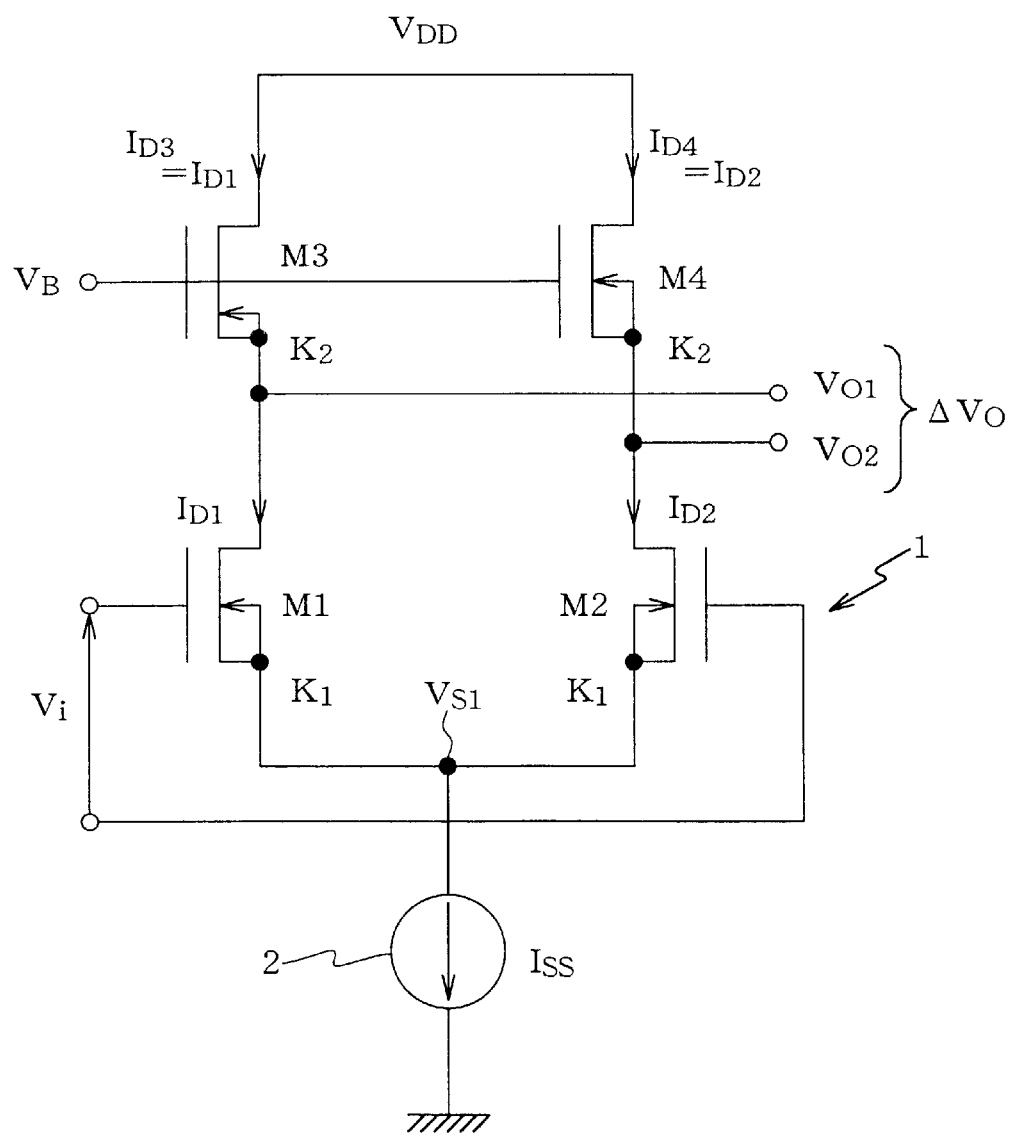
FIG. 8 is a circuit diagram showing a conventional linear transconductance amplifier
Figure 9:
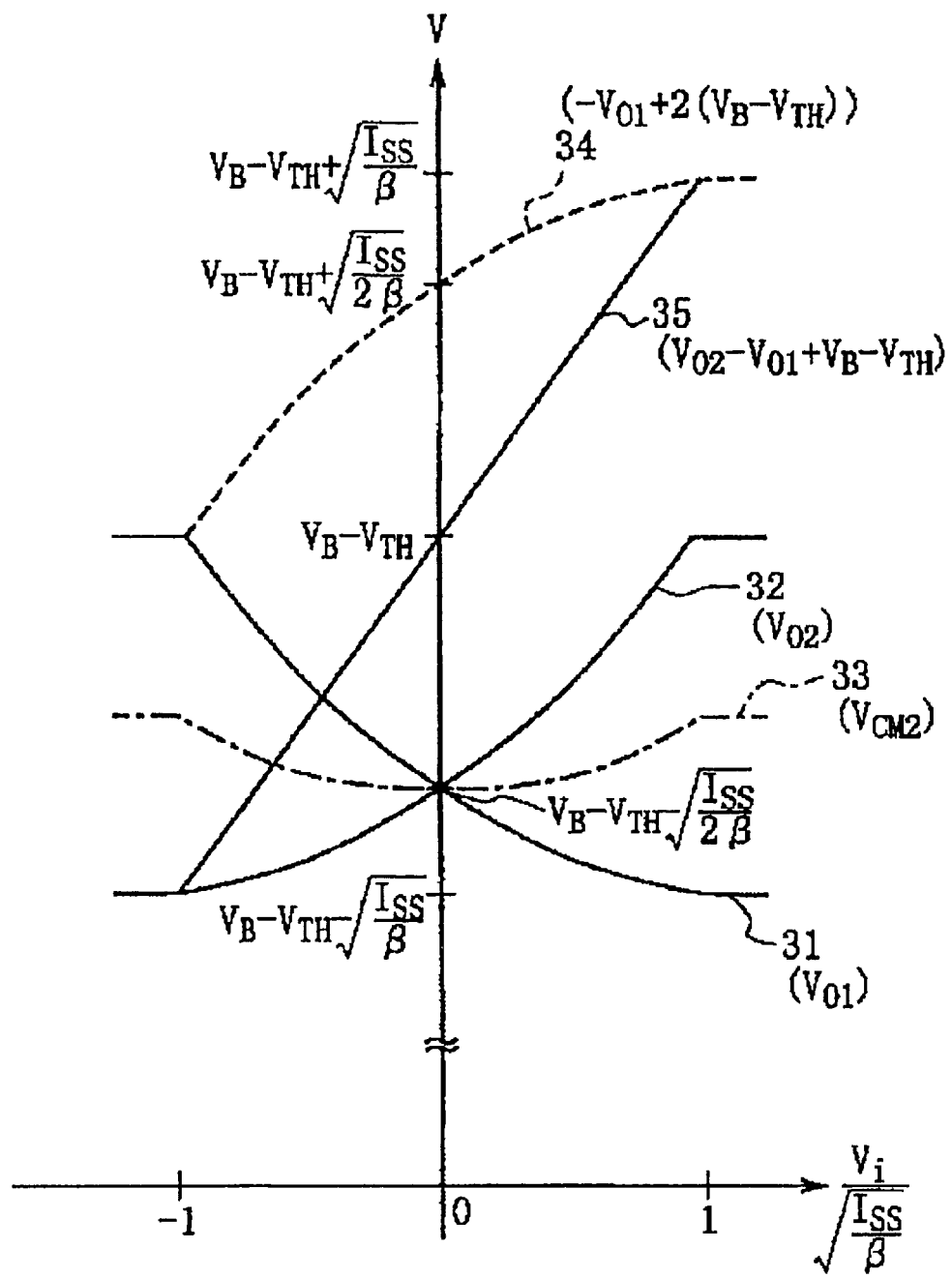
FIG. 9 is an explanatory diagram showing the linear operation of the conventional linear transconductance amplifier.
Figure 10:
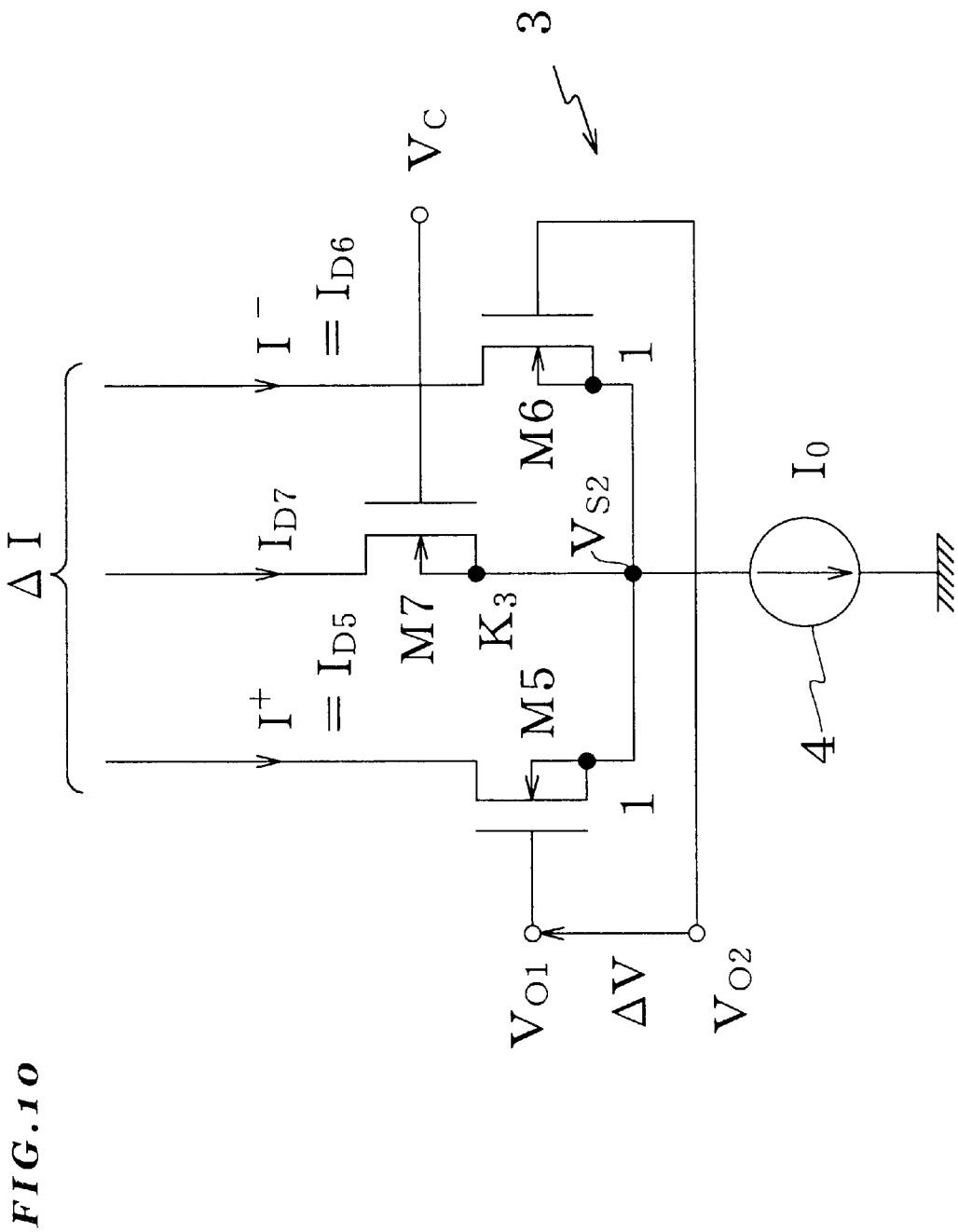
FIG. 10 is a circuit diagram showing a conventional linear transconductance amplifier (quadritail cell)
Figure 11:
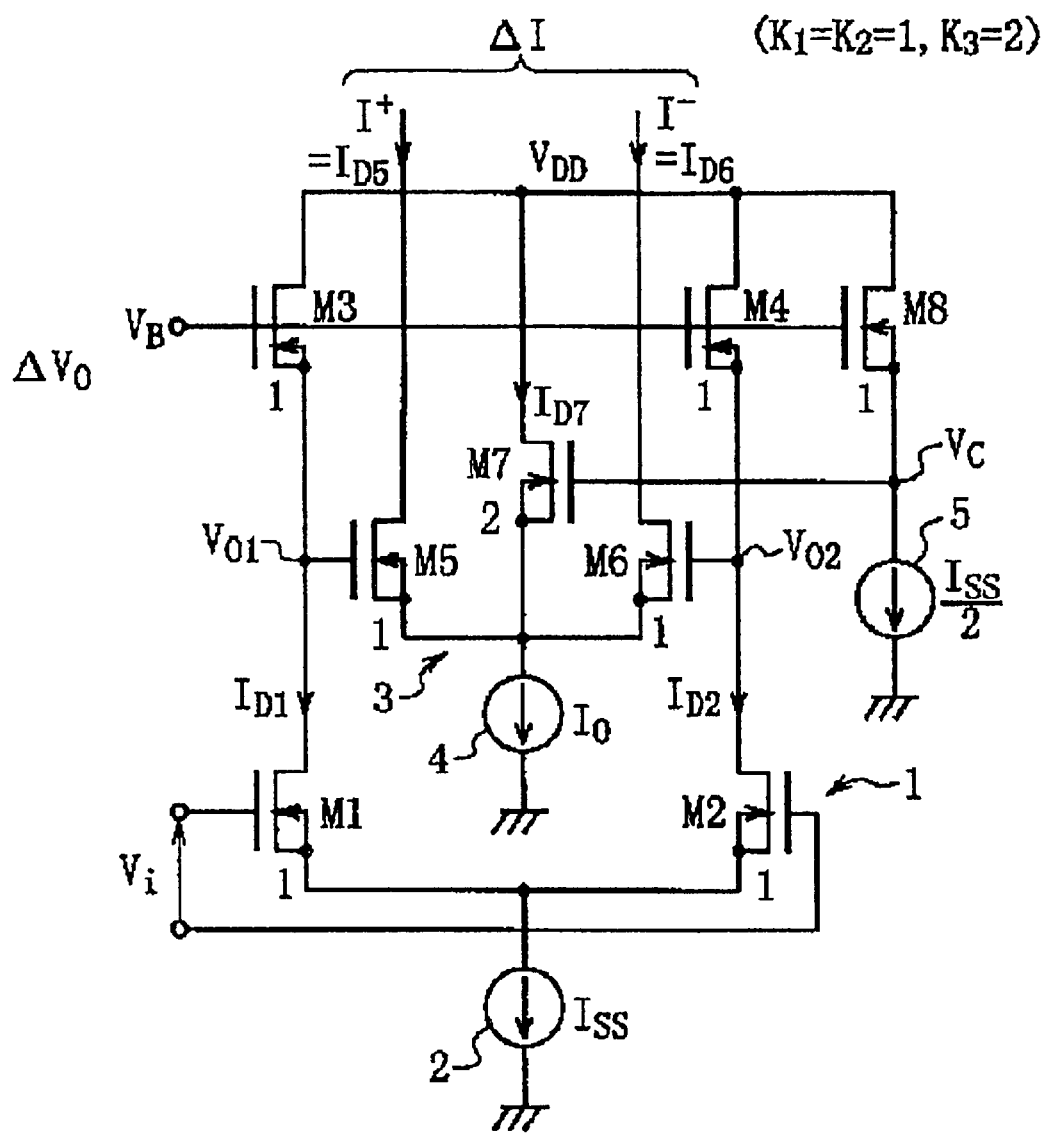
FIG. 11 is a circuit diagram showing another conventional linear transconductance amplifier.
Figure 12:
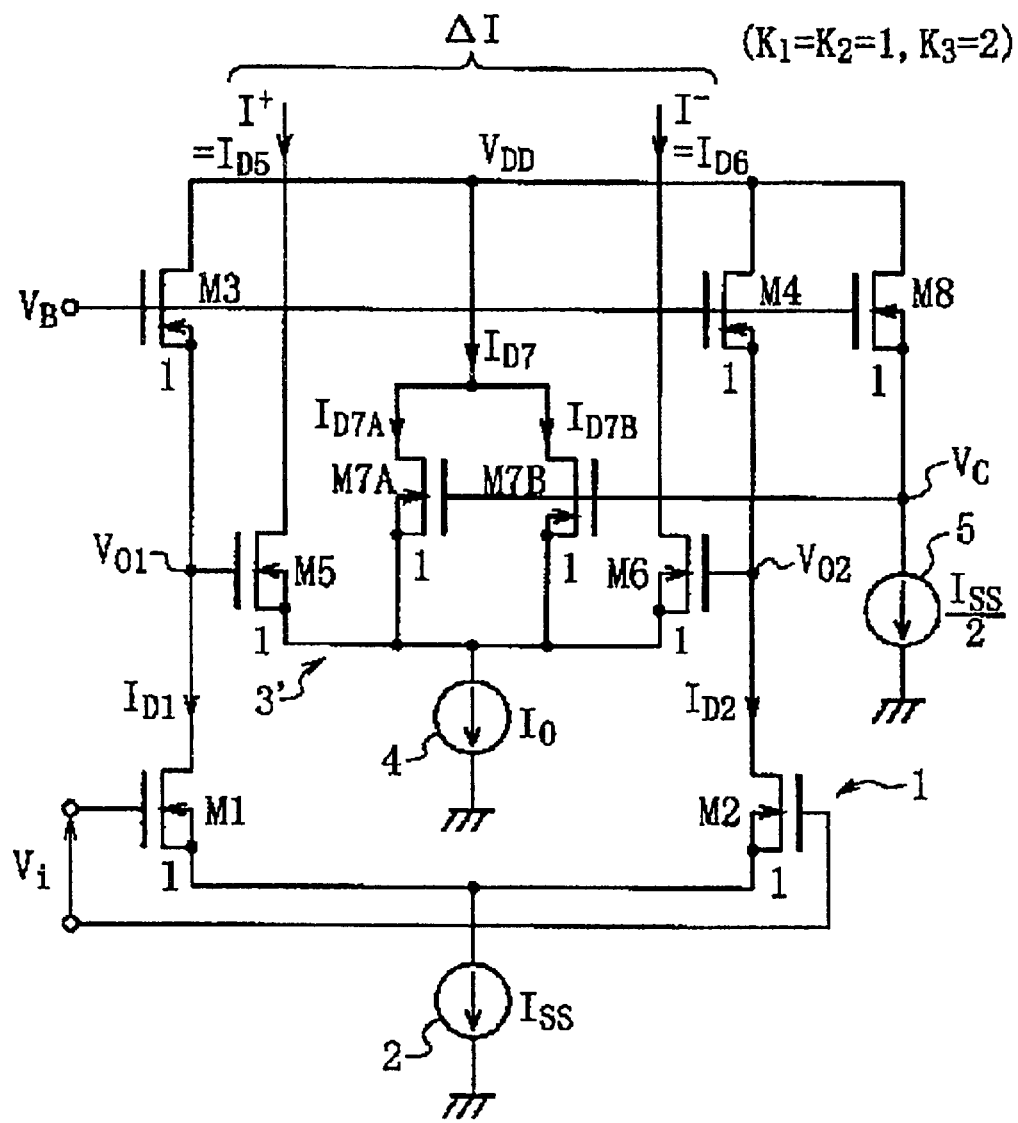
FIG. 12 is a circuit diagram showing a conventional class A linear transconductance amplifier.
Figure 13:
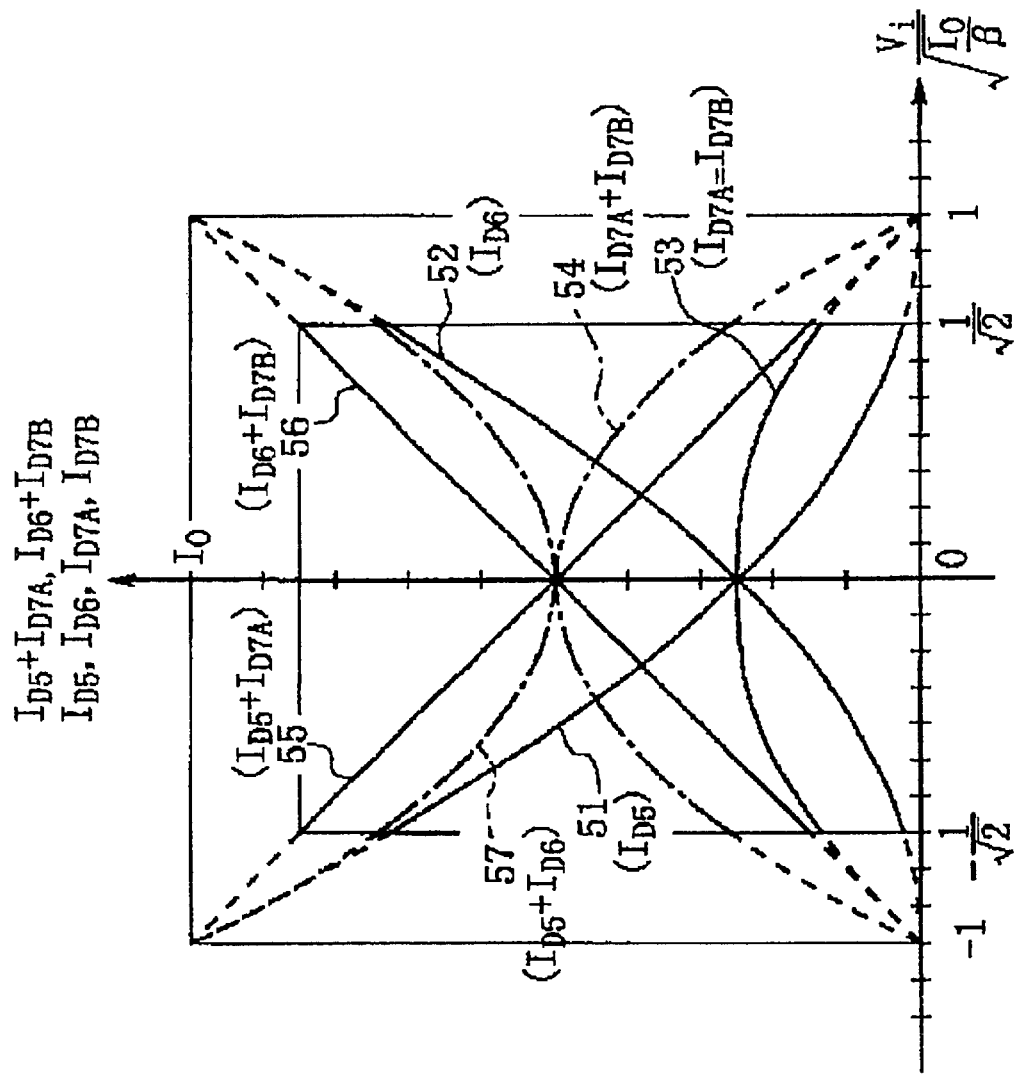
FIG. 13 is an explanatory diagram showing class A operation in the conventional linear transconductance amplifier.
Figure 14:
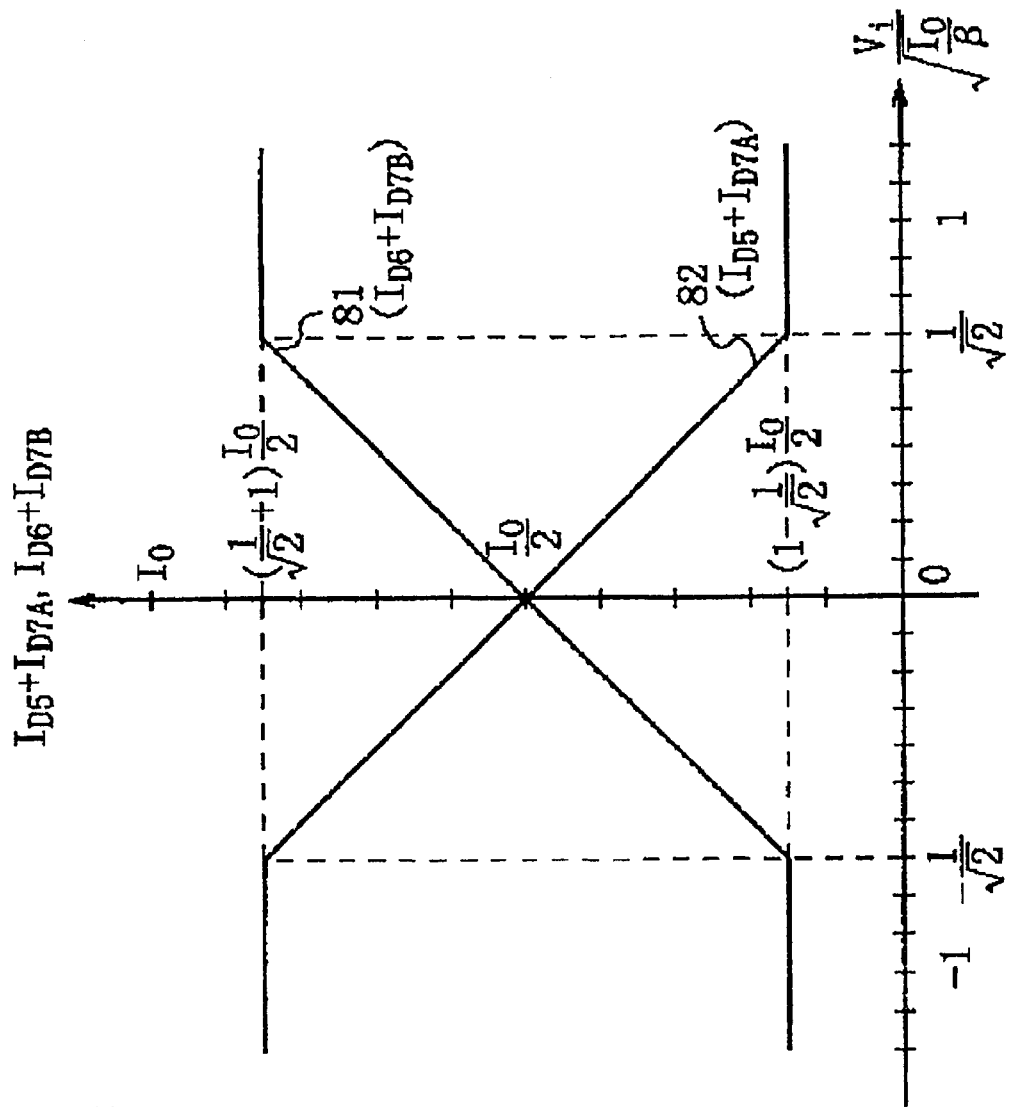
FIG. 14 is a characteristic diagram showing the output current of the conventional linear transconductance amplifier.
Figure 15:
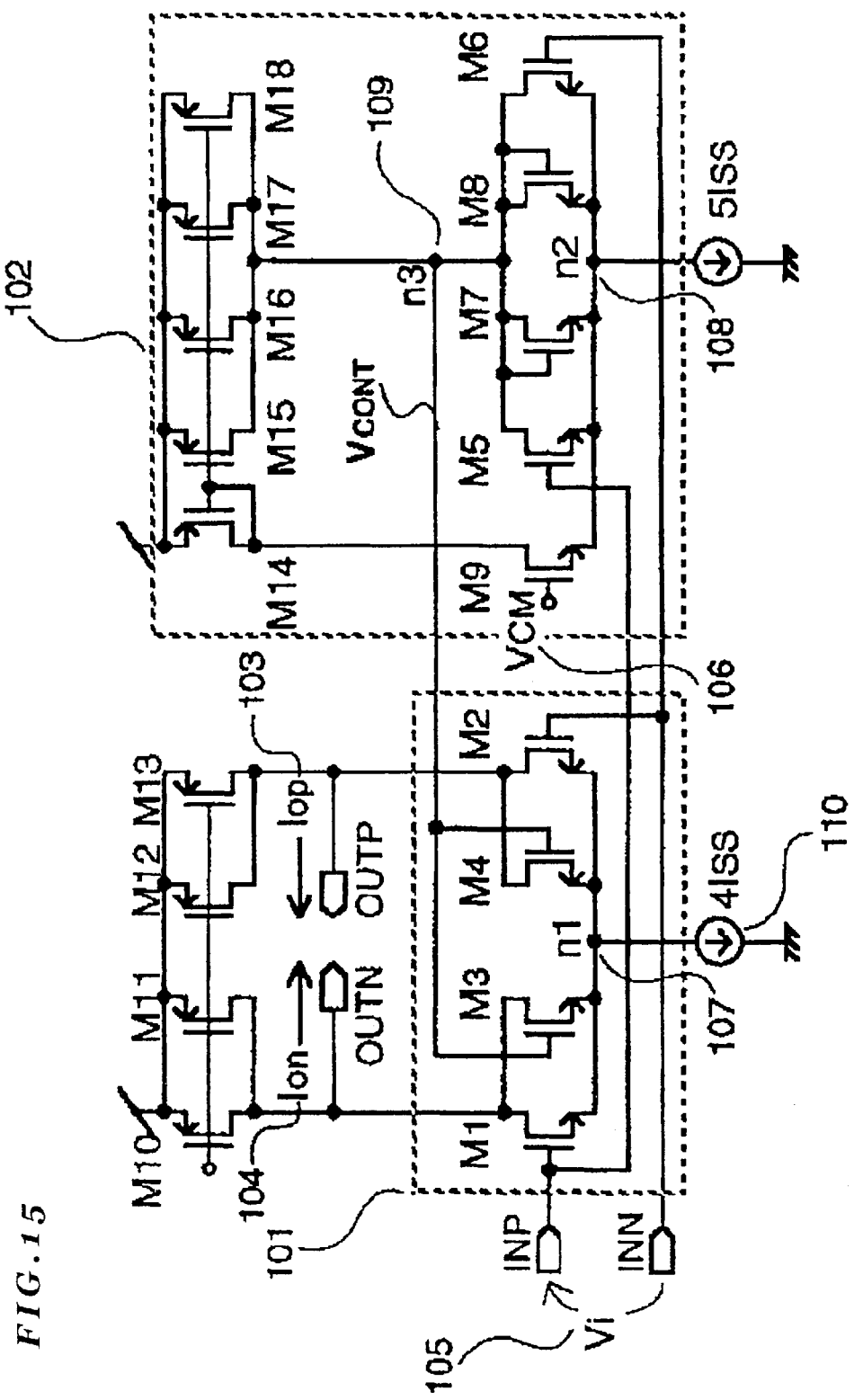
FIG. 15 is a circuit diagram showing another example of a conventional linear transconductance amplifier (quadritail cell).

Moreover, in the circuits shown in FIGS. 4 and 5, at the time of a non-signal ($V_i=0$), parameters of the transistors M0 to M5, M6A and M6B are set so that any current densities of transistors may become equal at the time of a non-signal ($V_i=0$). Hence, the common source voltage $V_{s1}$ of the first cell constituting the control voltage generating circuit, and the common source voltage $V_{s2}$ of the second cell constituting the output circuit become equal. Thus, even if one cell is made by mutually connecting the common source of the first cell and the common source of the second cell and driving currents of the two cells are added, the operation of this amplifier does not change at all. FIGS. 6 and 7 show examples of such circuits that all the sources of respective transistors are mutually connected in the circuits shown in FIGS. 4 and 5.

For example, an effect of the present invention is that a linear current can be obtained by adding the output currents. Thus, it is possible to realize an output circuit with N-channel transistors, and to improve frequency characteristics. This is because a class A operation can be realized and linearity can be provided by just adding a quadric curve, having a form of turning down a bowl, to either of a parabola rising to the right or a parabola rising to the left.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-272597 (Filed on Sep. 8th, 2000) including specification, claims, drawings and summary are incorporated herein by reference in its entirety.

What is claimed is:

1. A MOS (metal oxide semiconductor) linear transconductance amplifier, wherein gates of first and second transistors whose sources are directly coupled to ground form an input pair, to which a differential voltage is inputted, a gate and drain of a third transistor are mutually connected, drains of the first, second and third transistors are mutually connected and these transistors are driven by a constant current;

the MOS linear transconductance amplifier comprises means for adding a current flowing in the first transistor to a current that is a half of a current flowing in the third transistor, and means for adding a current flowing in the second transistor; and a current that is a half of a current flowing in the third transistor; and these two sum currents are made to be a differential output current.

2. A MOS (metal oxide semiconductor) linear transconductance amplifier, wherein gates of first and second transistors whose sources are directly coupled to ground form an input pair, to which a differential voltage is inputted, wherein a gate and drain of a third transistor are mutually connected, drains of the first, second and third transistors are mutually connected and these transistors are driven by a constant current;

a fourth transistor whose gate is mutually connected to the gate of the first transistor, a fifth transistor whose gate is mutually connected to the gate of the second transistor, and sixth and seventh transistors whose gates are mutually connected to the gate of the third transistor are mutually connected at their sources and are driven by a constant current;

drains of the fourth transistor and the sixth transistor are mutually connected and form one of a differential output pair;

drains of the fifth transistor and the seventh transistor are mutually connected, and form the other of the differential output pair; and each gate ratio (W/L) of the sixth and seventh transistors is a half of a gate ratio (W/L) of the third transistor.

3. A MOS (metal oxide semiconductor) linear transconductance amplifier, wherein gates of first and second transistors form an input pair, to which a differential voltage is inputted, wherein a gate and drain of a third transistor are mutually connected, drains of the first, second and third transistors are mutually connected and these transistors are driven by a constant current;

a fourth transistor whose gate is mutually connected to the gate of the first transistor, a fifth transistor whose gate is mutually connected to the gate of the second transistor, and sixth and seventh transistors whose gates are mutually connected to the gate of the third transistor are mutually connected at their sources and are driven by a constant current;

drains of the fourth transistor and the sixth transistor are mutually connected and form one of a differential output pair;

drains of the fifth transistor and the seventh transistor are mutually connected, and form the other of the differential output pair; and each gate ratio (W/L) of the sixth and seventh transistors is a half of a gate ratio (W/L) of the third transistor, wherein sources of the first, second and third transistors are mutually connected and are grounded through a resistor or a diode having a gate and source mutually connected.

4. A MOS (metal oxide semiconductor) linear transconductance amplifier comprises first, second, third and fourth transistors whose sources are mutually connected, and which are driven by a constant current, wherein a common voltage of a differential input voltage is applied to a gate of the first transistor, gates of the second and third transistors comprise an input pair, to which a differential voltage is inputted, a gate and drain of the fourth transistor are mutually connected, the second, third and fourth transistors are mutually connected at their drains and are driven by a constant current and a drain of said first transistor is directly connected to a voltage source of said amplifier;

wherein a fifth transistor whose gate is mutually connected to the gate of the second transistor, a sixth transistor whose gate is mutually connected to the gate of the third transistor, and seventh and eighth transistors whose gates are mutually connected to the gate of the fourth transistor are mutually connected at their sources and are driven by a constant current;

drains of the fifth transistor and seventh transistor are mutually connected and form one of a differential output pair, drains of the sixth transistor and eighth transistor are mutually connected, and form the other of the differential output pair, and each gate ratio (W/L) of the seventh and eighth transistors is a half of a gate ratio (W/L) of the fourth transistor.

5. The MOS linear transconductance amplifier according to claim 4, wherein if a current flowing in the first transistor comprises a reference current, currents having predetermined mirror ratios are supplied to the common drain of the second, third and fourth transistors, and one and the other of the differential output pair respectively.

6. The MOS linear transconductance amplifier according to claim 4, wherein a common source voltage of the first, second, third and fourth transistors is different from a common source voltage of the fifth, sixth, seventh and eighth transistors.

7. The MOS linear transconductance amplifier according to claim 5, wherein a common source voltage of the first, second, third and fourth transistors is different from a common source voltage of the fifth, sixth, seventh and eighth transistors.

8. The MOS linear transconductance amplifier according to claim 4, wherein sources of the first, second, third, fourth, fifth, sixth, seventh and eighth transistors are mutually connected.

9. The MOS linear transconductance amplifier according to claim 5, wherein sources of the first, second, third, fourth, fifth, sixth, seventh and eighth transistors are mutually connected.

10. The MOS (metal oxide semiconductor) linear transconductance amplifier of claim 1, wherein said differential output current is achieved in a circuit having a double-polarity configuration.

11. A MOS (metal oxide semiconductor) linear transconductance amplifier having an output circuit current larger than a control voltage generating circuit current, said MOS linear transconductance amplifier comprising:

a reference current circuit providing a reference current;

a control circuit receiving a differential input voltage, said control circuit consuming a current $I_B$ said current $I_B$ related to said reference current in a predetermined relation; and an output circuit also receiving said differential input voltage, said output circuit controlled by said control circuit, said output circuit consuming a current $I_0 = K_2 I_B$, where $K_2 > 1$.

12. The MOS linear transconductance amplifier of claim 11, wherein said control circuit comprises:

a first transistor having a first drain, a first source, and a first gate;

a second transistor having a second drain, a second source, and a second gate; and a third transistor having a third drain, a third source, and a third gate, wherein said first gate and said second gate form an input pair to which said differential voltage is inputted, said third gate and said third drain are mutually connected, said first drain, said second drain, and said third drain are mutually connected, and said first source, said second source, and said third source are mutually connected.

13. The MOS linear transconductance amplifier of claim 12, wherein said output circuit comprises:

a fourth transistor having a fourth drain, a fourth source, and a fourth gate;

a fifth transistor having a fifth drain, a fifth source, and a fifth gate;

a sixth transistor having a sixth drain, a sixth source, and a sixth gate; and a seventh transistor having a seventh drain, a seventh source, and a seventh gate, wherein said fourth source, said fifth source, said sixth source, and said seventh source are mutually connected, said fourth drain and said sixth drain are mutually connected, said fifth drain and said seventh drain are mutually connected, said fourth gate and said fifth gate form an input pair to which said differential voltage is inputted, and said sixth gate and said seventh gate are both connected to said third drain.

14. The MOS linear transconductance amplifier of claim 13, wherein a gate ratio of said first transistor and of said second transistor are essentially identical to a first ratio, a gate ratio of said third transistor is $K_1$ times said first ratio, a gate ratio of said fourth transistor and of said fifth transistor are essentially identical and equal to $K_2$ times said first ratio, and a gate ratio of said sixth transistor and of said seventh transistor are essentially identical and equal to $K_2(K_1/2)$.

15. The MOS linear transconductance amplifier of claim 14, wherein $1 \leq K_1 \leq 2$, and $K_2 \leq 2/(K_1+2)+1$.

16. The MOS linear transconductance amplifier of claim 12, wherein said mutually-connected first source, second source, and third source are connected directly to ground.

17. The MOS linear transconductance amplifier of claim 12, wherein said mutually-connected first source, second source, and third source are connected to ground through a resistor.

18. The MOS linear transconductance amplifier of claim 12, wherein said mutually-connected first source, second source, and third source are connected to ground through a constant current source.

19. The MOS linear transconductance amplifier of claim 13, wherein said mutually-connected fourth source, fifth source, sixth source, and seventh source are connected directly to ground.

20. The MOS linear transconductance amplifier of claim 13, wherein said mutually-connected fourth source, fifth source, sixth source, and seventh source are connected to ground through a constant current source.

21. The MOS linear transconductance amplifier of claim 12, further comprising:

a fourth transistor having a fourth drain, a fourth source, and a fourth gate, wherein said fourth source is connected to said first, second, and third sources and said fourth gate is connected to a biasing voltage.

22. The MOS linear transconductance amplifier of claim 16, further comprising:

a fourth transistor having a fourth drain, a fourth source, and a fourth gate, wherein said fourth source is connected to said first, second, and third sources and said fourth gate is connected to a biasing voltage.

23. The MOS linear transconductance amplifier of claim 17, further comprising:

a fourth transistor having a fourth drain, a fourth source, and a fourth gate, wherein said fourth source is connected to said first, second, and third sources and said fourth gate is connected to a biasing voltage.

24. The MOS linear transconductance amplifier of claim 18, further comprising:

a fourth transistor having a fourth drain, a fourth source, and a fourth gate, wherein said fourth source is connected to said first, second, and third sources and said fourth gate is connected to a biasing voltage.

* * * * *